United States Patent
Atchley et al.

(10) Patent No.: US 10,790,777 B2
(45) Date of Patent: Sep. 29, 2020

(54) FLEXIBLE SOLAR ROOFING MODULES

(71) Applicant: Tesla, Inc., Palo Alto, CA (US)

(72) Inventors: Brian Edward Atchley, Petaluma, CA (US); Andreas Meisel, Novato, CA (US); Daniel Preston Flanigan, Petaluma, CA (US); Tyrus Hawkes Hudson, San Rafael, CA (US)

(73) Assignee: Tesla, Inc., Palo Alto, CA (US)

( * ) Notice: Subject to any disclaimer, the term of this patent is extended or adjusted under 35 U.S.C. 154(b) by 0 days.

(21) Appl. No.: 15/679,687

(22) Filed: Aug. 17, 2017

(65) Prior Publication Data

US 2019/0058436 A1    Feb. 21, 2019

(51) Int. Cl.

| | |
|---|---|
| *H02S 20/23* | (2014.01) |
| *H02S 30/10* | (2014.01) |
| *H02S 20/25* | (2014.01) |
| *H02S 40/36* | (2014.01) |
| *F24S 25/35* | (2018.01) |
| *H01L 31/02* | (2006.01) |
| *H01L 31/05* | (2014.01) |
| *H01L 31/042* | (2014.01) |
| *F24S 20/00* | (2018.01) |

(52) U.S. Cl.
CPC .............. *H02S 20/23* (2014.12); *F24S 25/35* (2018.05); *H01L 31/0201* (2013.01); *H01L 31/042* (2013.01); *H01L 31/0504* (2013.01); *H02S 20/25* (2014.12); *H02S 30/10* (2014.12); *H02S 40/36* (2014.12); *F24S 2020/10* (2018.05); *Y02B 10/12* (2013.01); *Y02E 10/47* (2013.01)

(58) Field of Classification Search
CPC .......... H02S 20/23; H02S 30/10; H02S 20/25; H02S 40/36; F24J 25/35; Y02B 10/12; Y02E 10/50; Y02E 10/47; F24S 25/35; F24S 2020/10; H01L 31/0201; H01L 31/0504; H01L 31/042
USPC ....................................................... 52/173.3
See application file for complete search history.

(56) References Cited

U.S. PATENT DOCUMENTS 5,133,810 A * 7/1992 Morizane .......... H01L 31/03921
                                                  136/244
5,482,569 A * 1/1996 Ihara ................. H01L 31/03921
                                                  136/244

(Continued)

FOREIGN PATENT DOCUMENTS

| DE | 42 27 929 A1 | 3/1994 |
|---|---|---|
| DE | 20 2011 103 016 U1 | 12/2011 |
| FR | 2 916 464 A1 | 11/2008 |

*Primary Examiner* — Theodore V Adamos
(74) *Attorney, Agent, or Firm* — Dentons US LLP

(57) ABSTRACT

Building integrated photovoltaic (BIPV) systems provide for solar panel arrays that can be aesthetically pleasing to an observer. BIPV systems can be incorporated as part of roof surfaces as built into the structure of the roof, particularly as roofing modules that have photovoltaic elements embedded or incorporated into the body of the module, in distinct tiles-sized areas. The use of modules that replicate the look of individual roofing tiles (or shingles) can lead to a more efficient installation process. Further, modules can include flexible joints between the distinct tiles-sized areas, across which solar cells within the module are electrically connected. The flexibility granted to the modules also makes installation easier, and further improves the fatigue and strain resistance of the overall solar array for its operational life.

26 Claims, 13 Drawing Sheets

(56) References Cited

U.S. PATENT DOCUMENTS

| | | | | |
|---|---|---|---|---|
| 5,575,861 A * | 11/1996 | Younan | E04D 1/265 | |
| | | | 136/244 | |
| 5,701,067 A * | 12/1997 | Kaji | A45C 15/00 | |
| | | | 136/293 | |
| 5,855,692 A * | 1/1999 | Kaji | A45C 15/00 | |
| | | | 136/245 | |
| 6,380,477 B1 * | 4/2002 | Curtin | H01L 31/048 | |
| | | | 136/244 | |
| 7,019,207 B2 | 3/2006 | Harneit et al. | | |
| 8,109,048 B2 | 2/2012 | West et al. | | |
| 8,153,889 B2 | 4/2012 | Basol | | |
| 8,590,223 B2 | 11/2013 | Kilgore et al. | | |
| 8,981,205 B2 | 3/2015 | Nowlan | | |
| 9,074,758 B2 | 7/2015 | Oraw et al. | | |
| 9,966,898 B1 * | 5/2018 | Flanigan | H02S 20/25 | |
| 2004/0026115 A1 * | 2/2004 | Shaw | B41J 19/20 | |
| | | | 174/117 F | |
| 2005/0178430 A1 * | 8/2005 | McCaskill | E04D 1/26 | |
| | | | 136/251 | |
| 2006/0042681 A1 | 3/2006 | Korman | | |
| 2006/0131061 A1 * | 6/2006 | Seigerschmidt | H01B 7/0892 | |
| | | | 174/117 FF | |
| 2010/0101561 A1 * | 4/2010 | Frank | H02S 20/23 | |
| | | | 126/622 | |
| 2010/0146878 A1 * | 6/2010 | Koch | H01L 31/05 | |
| | | | 52/173.3 | |
| 2010/0147364 A1 | 6/2010 | Gonzalez et al. | | |
| 2011/0017278 A1 * | 1/2011 | Kalkanoglu | E04D 1/26 | |
| | | | 136/251 | |
| 2011/0030761 A1 * | 2/2011 | Kalkanoglu | E04D 5/12 | |
| | | | 136/245 | |
| 2011/0100436 A1 * | 5/2011 | Cleereman | H01R 31/00 | |
| | | | 136/251 | |
| 2012/0125391 A1 | 5/2012 | Pinarbasi et al. | | |
| 2012/0204927 A1 * | 8/2012 | Peterson | H01L 31/048 | |
| | | | 136/244 | |
| 2012/0291855 A1 | 11/2012 | Lee et al. | | |
| 2013/0206213 A1 | 8/2013 | He et al. | | |
| 2013/0212959 A1 * | 8/2013 | Lopez | H02S 40/36 | |
| | | | 52/173.3 | |
| 2014/0124034 A1 * | 5/2014 | Nishimoto | H01L 31/0201 | |
| | | | 136/259 | |
| 2015/0068582 A1 * | 3/2015 | Chaney | B32B 37/06 | |
| | | | 136/245 | |
| 2015/0083191 A1 * | 3/2015 | Gmundner | H01L 31/048 | |
| | | | 136/245 | |
| 2016/0164453 A1 | 6/2016 | Cropper et al. | | |
| 2016/0380579 A1 | 12/2016 | Gong | | |

* cited by examiner

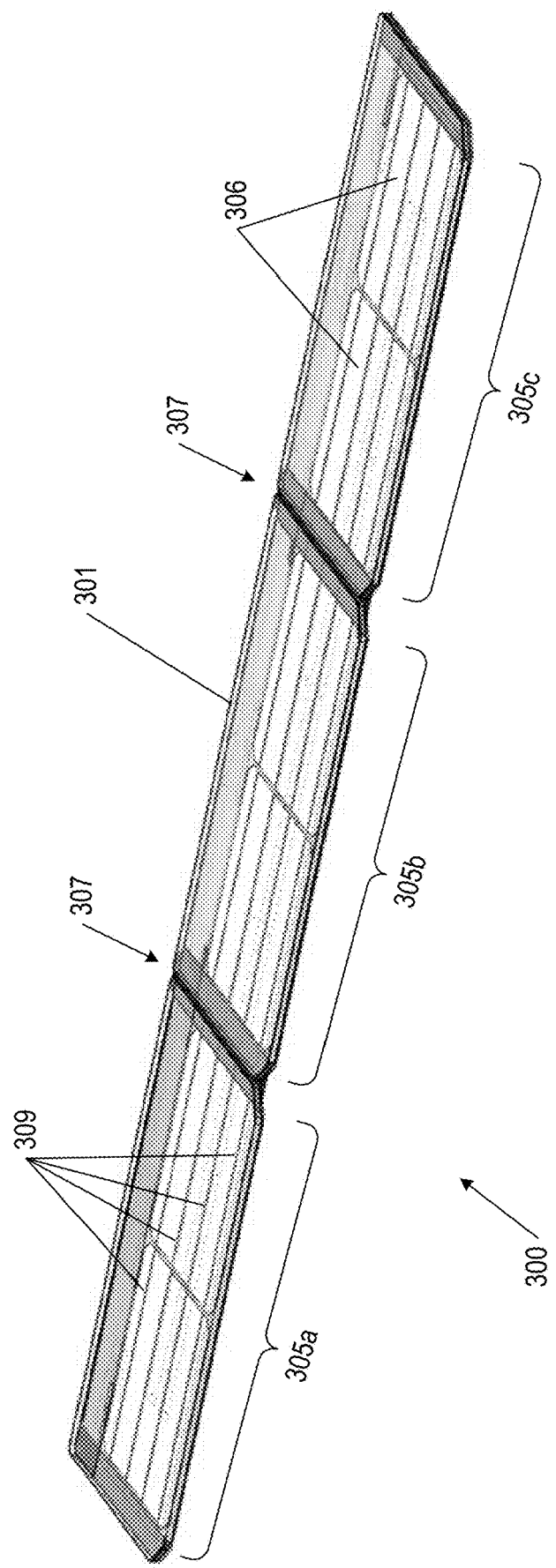

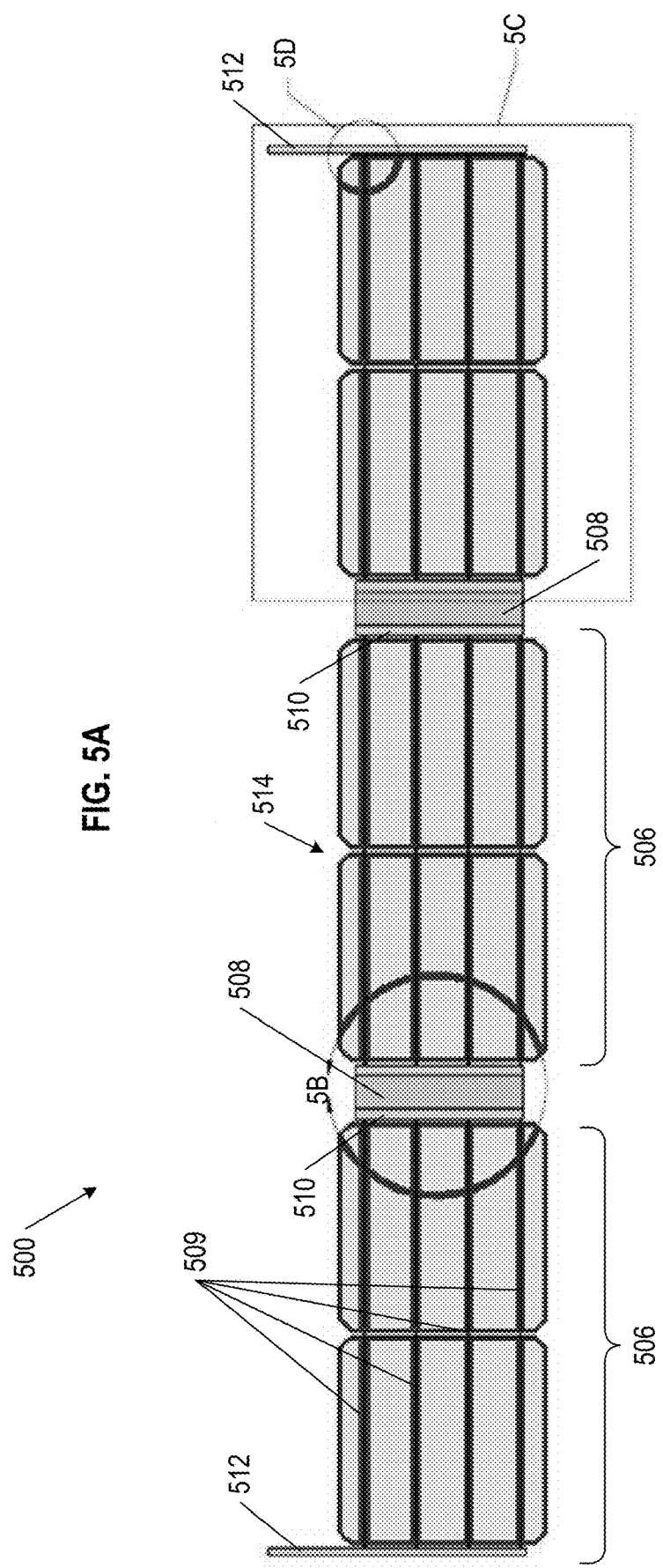

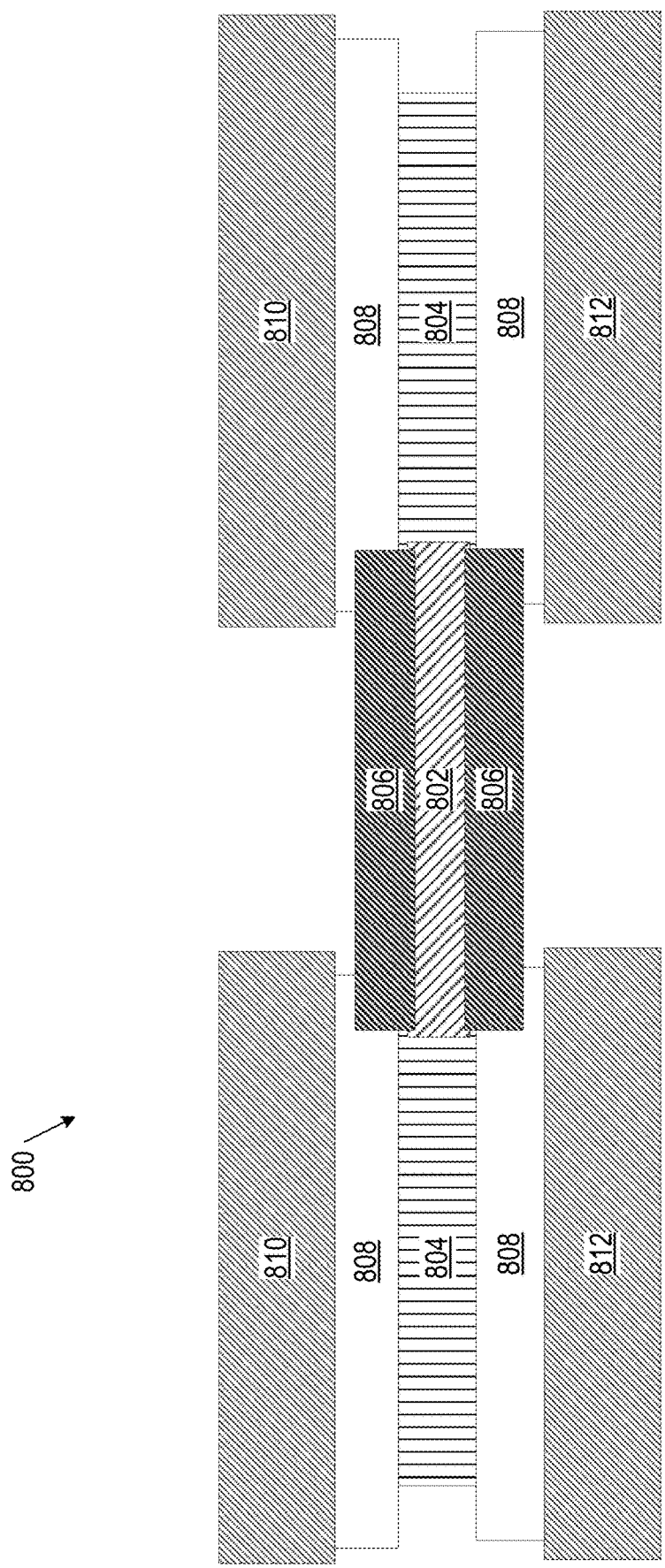

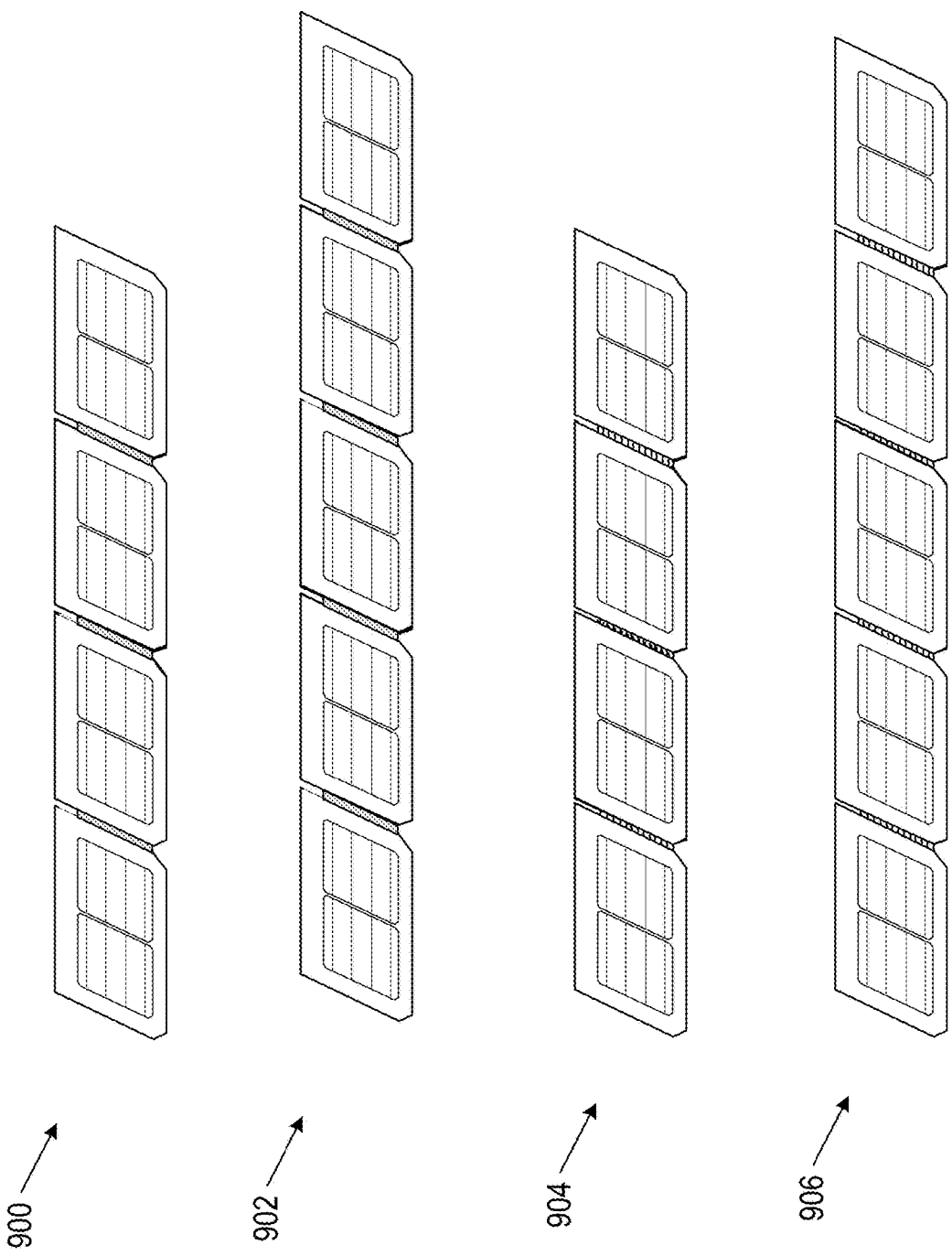

FLEXIBLE SOLAR ROOFING MODULES

TECHNICAL FIELD

This generally relates to photovoltaic arrays.

BACKGROUND

Solar is becoming increasingly popular in the United States and abroad, but penetration remains relatively low versus the number of homes that could benefit from solar. The price per kilowatt for solar is now competitive with or below that of fossil fuel-based utility power in most areas, however, solar largely remains a niche product for those who value saving money, reducing $CO_2$ emissions, or both.

One factor that may limit the adoption of solar technology is aesthetics. Most residential solar systems are installed as modules over an existing tile or composition shingle roof. The solar array, which often only covers a portion of the roof, or even a portion of one mounting plane of the roof, stands out as separate and distinct from the existing roof, both in height and material. This difference is therefore visible from the street level and even over large distances.

Further, the time and complexity of a solar array installation can be an obstacle to the adoption of solar technology. Many improvements have been made to streamline and improve the process of installing, mounting, and connecting individual solar panels, but there remains an opportunity for innovating and even better refining the systems and methods of installing different types of photovoltaic arrays.

Another obstacle to solar adoption in existing homes is the dissonance between the age of the existing roof and the solar system, particularly where the existing roof is made from composition shingles. The expected life of a modern-day solar system is 25 years or more, and the expected life of a composition shingle roof is also about 25-35 years, depending on the local climate and specific materials. At the time a customer is considering going solar, their existing roof may be several years, if not decades, into that lifespan. So the customer may be presented with the dilemma of getting a new roof first, increasing the cost of going solar, or installing a 25-year solar system on a roof which may have a relatively shorter remaining operational lifespan.

Accordingly, there is a need to resolve the dissonance between the expected life of the solar system and the remaining life of the roof that also blends in more aesthetically with the complete roof surface or at least the mounting plane, and that does not require the prospective customer to pay for a new roof and a new solar system over that roof.

BRIEF SUMMARY

Various embodiments provide a new and improved approach to installing solar on new roofs and existing roofs, and in particular, presenting a roof that appears to be a tile roof. Some aspects fit over an existing tile roof and/or other suitable roof surfaces (e.g., a metal roof, composite shingle, roof deck, underlayment or insulation layer). In particular, aspects of the roofing installation are modular and flexible, which simplifies installation as well as replacement of individual photovoltaic modules of the system. In addition, some aspects cost less to make and install compared to conventional solar systems. Further, some arrangements of photovoltaic portions (and/or non-photovoltaic portions) of modules can generate a visual pattern and aesthetic that appears consistent with traditional roofing materials. Some solar systems can be installed as a new roof rather than a re-roof or mounted to an existing roof. These and other embodiments are discussed in greater detail in the detailed description and drawing figures.

In some embodiments, the present disclosure is directed toward a flexible solar or photovoltaic module having a plurality of photovoltaic (PV) elements including: a first PV tile area; a second PV tile area; a third PV tile area, where the first PV tile area, second PV tile area, and third PV tile area are arranged linearly with respect to each other as part of the flexible solar module, with the first PV tile area adjacent to the second PV tile area, and with the second PV tile area adjacent to the third PV tile area; a first flexible joint, electrically and structurally connecting the first PV tile area and the second PV tile area; a second flexible joint, electrically and structurally connecting the second PV tile area and the third PV tile area; and a plurality of bus bars adapted to support the PV tile areas and to provide a common power bus to receive the power output of each PV tile area. It can be understood that in some implementations, the first PV tile area and the third PV tile area are arranged to be on opposite sides of the second PV tile area, within their linear arrangement relative to each other. In some implementations, the flexible solar module can further include a fourth PV tile area, arranged linearly with and adjacent to the third PV tile area, on the opposite side of the third PV tile area from the second PV tile area.

In some aspects, flexible solar modules as disclosed herein can include a first flexible joint and a second flexible joint that are each formed from a ribbon wire. In such aspects, each PV tile area can include two paired solar cells, and a plurality of bus bars that are arranged such that there is a bus bar on the left side and on the right side of each PV pairing of solar cells.

In other aspects, flexible solar modules as disclosed herein can include a flexible joints formed of a conductive metal foil interconnection, and particularly a copper foil interconnection. In such aspects with a metal foil-based flexible joint, each PV tile area can include two paired solar cells, and the plurality of bus bars are arranged such that a first bus bar is located on the left side of the solar cells in the first PV tile area, and a second bus bar is located on right side of the solar cells in the third PV tile area. In implementations where a copper foil interconnection is electrically connected to and spans a gap between two adjacent PV tile areas, the section of the copper foil spanning the gap can be covered with a dielectric material. Further, in implementations where the copper foil interconnection is electrically connected to and spans a gap between two adjacent PV tile areas, the sections of copper foil connected to the two PV tile areas can be covered with a tin coating, securing the copper sheet to the PV tile areas. In some aspects, the copper foil can have a thickness of from about 0.1 mm to about 0.4 mm, or a thickness at increments or gradients within that range.

In some aspects, the first flexible joint and the second flexible joint can each have a strain-life of about 30,000 cycles for a range of motion of up to 5°. In other aspects, the first flexible joint and the second flexible joint can each have a strain-life of about 1,000 cycles for a range of motion of up to 15°.

In other embodiments, the present disclosure is directed to building integrated photovoltaic (BIPV) roofing system including: a plurality of flexible solar modules, where the flexible solar modules each have an appearance that is similar to three or more individual tile areas; a plurality of photovoltaic roof tiles; and an underlying roof structure, where the building's roof envelope is formed by courses of flexible solar modules mounted to the roof structure, where individual members of the plurality of photovoltaic roof tiles are arranged at ends of the courses of the roof envelope, and where the plurality of flexible solar modules and the plurality of photovoltaic roof tiles are electrically connected to each other to form a solar array.

In some aspects, the flexible solar modules of the BIPV roofing system can include: a header region; a first PV tile area; a second PV tile area; a third PV tile area, the first PV tile area, second PV tile area, and third PV tile area being arranged linearly, with the first PV tile area adjacent to the second PV tile area, and with the second PV tile area adjacent to the third PV tile area; a first flexible joint, the first flexible joint being located within or under the header region, electrically connecting the first PV tile area and the second PV tile area; a second flexible joint, the second flexible joint being located within or under the header region, electrically connecting the second PV tile area and the third PV tile area; and a plurality of bus bars adapted to support the PV tile areas and to provide a common power bus to receive the power output of each PV tile area. In further aspects, the first flexible joint and the second flexible joint can be ribbon wire connections. In other aspects, the first flexible joint and the second flexible joint can be copper-based foil connections. In yet further aspects, individual photovoltaic roof tiles can be arranged in gaps between flexible solar modules, within the courses of the roofing system.

In further embodiments, the present disclosure is directed to a method of assembling a flexible solar module, in particular for a BIPV roofing system, where the process includes: providing a module frame with three photovoltaic tile areas in a linear arrangement; setting two, paired solar cells within each photovoltaic tile area; electrically and structurally connecting paired solar cells in adjacent photovoltaic tile areas with flexible joint connections; and connecting outlet bus bars to outermost solar cells set within the module frame. In some implementations, the flexible joint connections can be ribbon wires that electrically and structurally connect paired solar cells by soldering the ribbon wire to local bus bars positioned between solar cells in adjacent photovoltaic tile areas. In other implementations, the flexible joint connections can be metal foil connections that electrically and structurally connect paired solar cells via soldering (or "tinning") metal foil to solar cells in adjacent photovoltaic tile areas.

BRIEF DESCRIPTION OF THE DRAWINGS

Illustrative aspects of the present disclosure are described in detail below with reference to the following drawing figures. It is intended that that embodiments and figures disclosed herein are to be considered illustrative rather than restrictive

FIG. 3 shows an exemplary flexible photovoltaic module, having three PV tile areas having, in accordance with embodiments of the disclosure.

FIG. 5A shows an exemplary set of solar cells connected via metal foil, and configured for use as part of a flexible photovoltaic module, in accordance with aspects of the disclosure.

FIG. 8 is a schematic of an exemplary conductive metal foil connection between two adjacent solar cells, in accordance with embodiments of the disclosure.

FIG. 9 shows a set of exemplary flexible photovoltaic modules with solar cells connected via flexible joints, in accordance with embodiments of the disclosure.

DETAILED DESCRIPTION

Figure 1A:
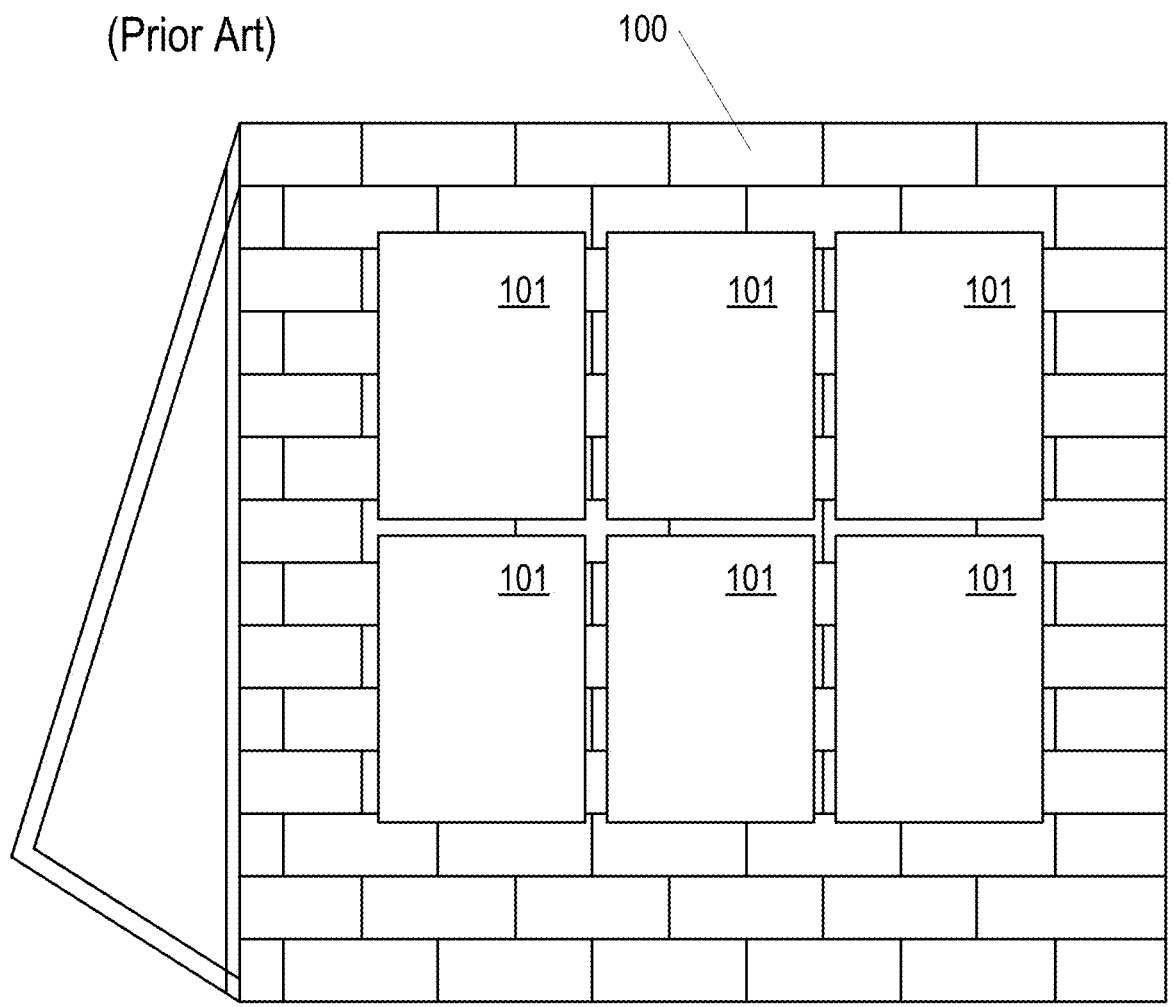
FIG. 1A shows an example of a prior art photovoltaic array installed on a roof.

The present disclosure describes various embodiments of photovoltaic roofing systems and associated systems and methods, and in particular building integrated photovoltaic roofing systems. Some embodiments relate to building integrated photovoltaic module assemblies and associated systems and methods. In various embodiments, the systems described herein lower costs of conventional systems in which a photovoltaic ("PV") system is installed over a roof, and at the same time can provide an improved aesthetic for a PV roof system, and particularly for a building integrated photovoltaic ("BIPV") system.

Certain details are set forth in the following description and in the Figures to provide a thorough understanding of various embodiments of the present technology. Other details describing well-known structures and systems often associated with PV systems, roofs, etc., however, are not set forth below to avoid unnecessarily obscuring the description of the various embodiments of the present technology.

There is a constant need to improve upon the speed and efficiency of the installation process of PV systems, the visual aesthetic of an installed PV array, as well as the resilience and operational lifetime of PV systems and arrays. Innovations as considered by the present disclosure employ a flexible PV module, generally spanning a width equal to three PV tiles (or shingles), that provides for a structural component that reduces installation time, is visually appealing, and includes non-rigid features that can improve upon the functional lifespan of each PV module. In particular, the flexibility of the PV modules disclosed herein allows for an ease of installation due to the slack and ability to adjust the edges of the PV modules as they are being arranged as part of an array, thereby improving upon the installation and assembly process, which generally takes less time than assembly of a traditional, rigid PV structure. Further, the PV module having a form factor equivalent to having three PV tiles built into the module, but distinct from each other and spaced to appear as if they are physically separate, improves the installation time (installing "three PV tiles" at once as opposed to only one at a time) and reduces connector counts over individual roof tiles, while concurrently presenting a visually pleasing roof structure to an average observer. Finally, the flexibility of the PV modules can result in a structure that can better withstand environmental strains (e.g., wind shear, uplift, thermal expansion & contraction, etc.) and uneven roof surfaces due to the range of tilting freedom provided between paired solar cells or PV tiles of the flexible PV module. Further details of these advantages are discussed below.

Many of the details, dimensions, angles and other features shown in the Figures are merely illustrative of particular embodiments. Accordingly, other embodiments can include other details, dimensions, angles and features without departing from the spirit or scope of the present invention. Various embodiments of the present technology can also include structures other than those shown in the Figures and are expressly not limited to the structures shown in the Figures. Moreover, the various elements and features shown in the Figures may not be drawn to scale. In the Figures, identical reference numbers identify identical, or at least generally similar, elements.

As used herein, the term "substantially" refers to the complete or nearly complete extent or degree of an action, characteristic, property, state, structure, item, or result. For example, an object that is "substantially" uniform in height to another object would mean that the objects are either completely or nearly completely uniform in height. The exact allowable degree of deviation from absolute completeness may in some cases depend on the specific context, however, generally speaking, the nearness of completion will be so as to have the same overall result as if absolute and total completion were obtained.

As used herein, the term "about" is used to provide flexibility to a numerical range endpoint by providing that a given value may be "above" or "below" the value. For example, the given value modified by about may be ±10% relative to the given value.

Wherever used throughout the disclosure and claims, the term "generally" has the meaning of "approximately" or "closely" or "within the vicinity or range of". The term "generally" as used herein is not intended as a vague or imprecise expansion on the term it is selected to modify, but rather as a clarification and potential stop gap directed at those who wish to otherwise practice the appended claims, but seek to avoid them by insignificant, or immaterial or small variations. All such insignificant, or immaterial or small variations should be covered as part of the appended claims by use of the term "generally".

As used herein, the term "building integrated photovoltaic system" or "BIPV" generally refers to photovoltaic systems integrated with building materials to form at least a portion of a building envelope. For example, the BIPV system can form the roof or roofing membrane of a building. The BIPV systems described herein can be retrofitted, can be a part of a new construction roof, or a combination of both. Such building integrated photovoltaic structures can be alternatively referred to as building integrable photovoltaic ("BIP") or building applied photovoltaics ("BAPV"). Components of a BIPV system used, in part, as part of the actual building envelope (e.g., roofing membrane), can provide a watertight or substantially watertight seal for the roof surface.

For the sake of distinguishing between structural elements of the present BIPV system, as used herein, the term "solar cell" refers to the structures of the system with solar energy collecting elements, the term "PV roof tile" refers to such solar collecting elements as mounted or adhered to a single structural roof tile, and the term "PV module" refers to a set of solar cells (or other PV units) that are mechanically and electrically connected to each other as part of a single structural unit. In the context of a PV module, the term "PV tile area" refers to sections of the PV modules that can each appear similar to a PV roof tile, and are configured to support solar cells similarly to a single PV roof tile.

As used herein, the terms "up-roof" and "down-roof" are used to provide orientation, direction, position, or a reference point relative to or in context of a roof or roofing surface upon which the systems described herein are installed on and/or from a portion of. Up-roof generally refers to an orientation that is relatively closer to the roof ridge while down-roof refers to an orientation that is relatively closer to the roof eave.

As used herein, the singular forms "a", "an", and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Spatially relative terms, such as "beneath", "below", "lower", "above", "upper", and the like, may be used herein for ease of description to describe one element or feature's relationship to another element(s) or feature(s) as shown in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below, depending on the context of its use. The device may be otherwise oriented (rotated 90 degrees or at other orientations) and the spatially relative descriptors used herein are interpreted accordingly.

Although the terms "first", "second", etc. may be used herein to describe various elements, components, regions, layers and/or sections, it should be understood that they should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

As used herein, the terms "and/or" and "at least one of" include any and all combinations of one or more of the associated listed items.

Generally, PV modules include crystalline-based solar panels, which can be either or both of monocrystalline solar panels or polycrystalline (multi-crystalline) solar panels. The laminate or wafer forming the solar energy-collecting surface of such PV modules can be mechanically coupled, adhered, or bonded to structurally supporting tiles. In some embodiments, PV modules can include layers of amorphous silicon or thin film variations of solar energy-collecting laminates, or thin-film solar materials directly applied as continuous sheets. Generally, PV elements as considered herein, which can include solar cells and laminates, have individual structures that can be used in combination to form larger solar arrays and/or building structures such as PV modules, as set forth below. Alternatively, thin-film PV modules, such as cadmium telluride, copper-indium-gallium-diselenide ("CIGS"), or amorphous thin-film silicon may be used. In still further embodiments, cells based on perovskite or other as of yet non-commercialized materials may be used. The particular type of cell technology used for any given installation can be selected both for solar energy collecting functionality and for aesthetic qualities, as related to the present disclosure.

The present disclosure is directed toward a particular implementation of a flexible PV module and further toward the assembling of PV arrays on a roof with such modules. In many embodiments, such PV arrays are configured as BIPV roofing systems. In several aspects, the present PV module is formed of three PV tile areas, each PV tile area having solar cells mounted therein. The PV tile areas are generally configured linearly, giving the PV module an elongate shape. It is understood that PV modules as considered herein are not limited to three-PV-tile embodiments, but rather can also include modules having two, four, or more than four PV tiles. Moreover, it should be appreciated that PV or BIPV arrays formed with such PV modules can also include single PV roof tiles deployed in combination with the PV modules, where appropriate for specific spacing, gaps, or edges of the overall PV array. Further, the junction or interface between each of the PV tile areas of a PV module is constructed to allow for flexibility and a degree of bending between adjacent PV tile area, which provides for advantages in assembly and resilience over the lifetime of a PV array installation using such PV modules. As with standard structural roof tiles, for BIPV implementations, these construction elements are used to form the envelope of a roof, often as part of a re-roofing job replacing an existing tile roof, for example an original roof that has reached its end-of-life The flexible PV module according to the various embodiments of the invention provides for improved ease of construction, as assembling (or disassembling) a PV array with a structural unit three tiles wide is often quicker than assembling a similar PV array one tile at a time. In some alternative embodiments, the modules can have two tiles, four tiles, five tiles, or more than five tiles (all connected in similar fashion as the embodiments described below, and all with similar structural and electrical connection considerations). A BIPV roofing system can use three-tile-width flexible PV modules along with single PV tile components, where the single PV tiles can be placed on the roof at the edges or in locations where a three-tile-width flexible PV module may not fit due to size or arrangement on the underlying roof. The underlying roof structure, in combination with the flexible PV modules and single PV tile components, can form a roof envelope for a BIPV roofing system.

PV elements that are distributed over all roof surfaces can have a visual uniformity that is neat, generally continuous, and elegant. Adjusting the density of PV elements on a roof surface changes both the appearance of the overall roof and the energy production of the solar array on the roof, typically measured in kilowatts (kW) or kilowatt-hours (kWh). Accordingly, the density of PV elements can be adjusted to achieve a desired kilowatt-hour production goal while maintaining an even distribution of the PV elements with a consistent visual aesthetic. In some aspects, PV elements can be distributed on the surface of a roof in a randomized, semi-randomized, or non-regular pattern to achieve the aesthetically pleasing neat, generally continuous, and elegant appearance.

Referring now to the drawing figures, in contrast with embodiments of the present disclosure, FIG. 1A shows an exemplary prior art PV array installed on roof 100. The exemplary PV array of FIG. 1A includes six solar panels 101 or modules which (though not shown in detail) are mounted on roof 100 using one of various known rail-based or rail-free mounting systems, as are currently employed by solar installers, such as Palo Alto, Calif.-based Tesla, Inc. (formerly SolarCity).

Figure 1B:
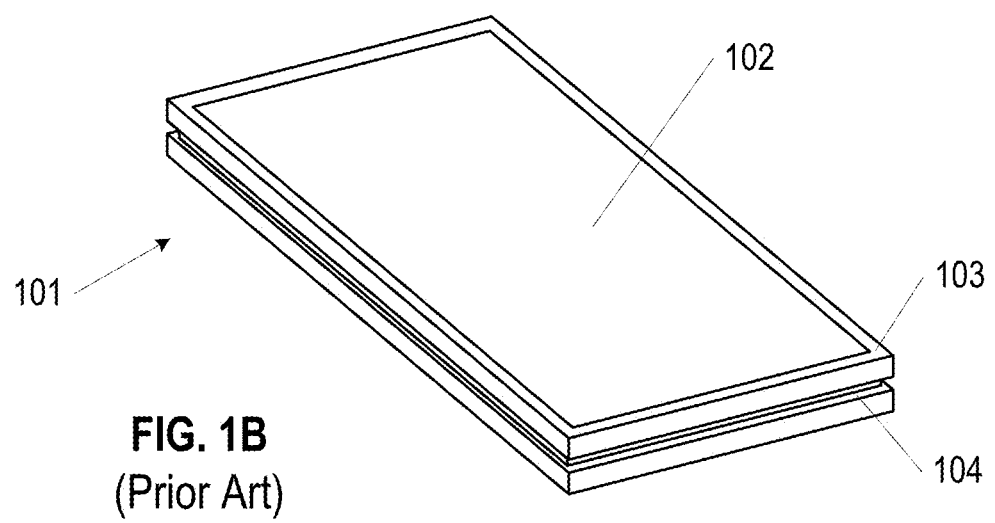
FIG. 1B shows an exemplary prior art photovoltaic module.

FIG. 1B shows one type of conventional solar panel 101 in more detail. Solar panel 101 includes PV laminate 102, which in conventional silicon-based cells, consists of a silicon sandwich of p-doped and n-doped silicon layers, a top glass sheet protecting the laminate, and a back sheet that can include a plurality of layers—and rigid metal frame 103, supporting PV laminate 102. Although shown as a unitary structure in FIG. 1B, laminate 102 may include a plurality of individual solar cells that are wired together to form a single unit under the top glass sheet. In the example shown in FIG. 1B, frame 103 is a grooved frame with groove 104 surrounding the outer face of frame 103 on all sides. Grooved frame modules such as module 101 are manufactured and sold by Tesla, Inc. of Palo Alto, Calif. In such a module, groove 104 serves as a mechanism for attaching other mounting hardware (e.g., leveling feet, interlocks, array skirts, etc.) to join modules together and to support the modules over a roof surface. Those of ordinary skill in the art will appreciate that panel 101 may also have a plain, non-grooved frame. Non-grooved frames are typically interconnected to one another and connected to the roof using connectors that clamp down between the top and bottom edges of the frame.

Although these types of framed PV modules achieve their structural function, they are aesthetically suboptimal for some would-be customers and have material usage inefficiencies. First, conventional PV systems, such as that shown in FIG. 1A, are typically installed over an existing roof, and not as part of the existing roof, essentially requiring redundant structure since the PV array will shield most of the portion of the roof that it is installed over. Second, conventional systems are deemed by some people to be unappealing, having a choppy, discontinuous, and/or extraneous aesthetic. Conventional PV modules usually come in one of two colors: blue, signifying a poly-crystalline silicon structure, and black, signifying a mono-crystalline silicon or thin-film structure. The metal frame portion can be painted black to help it blend in with the roof surface, or it can simply be raw aluminum but regardless of whether blue or black modules are used, the difference between the look of the portion of the roof that is covered with solar panels and the remainder of the roof is generally quite dramatic. This contrast can be particularly jarring when a conventional PV array is mounted on a tile roof because the tile roof will differ not only in color and texture, but also in contour. As a result, roofs that are partially covered with solar panels have an aesthetic contrast that can be seen from very far distances due to the difference in reflectivity, elevation, height, and/or color between these two very different surfaces.

Flexible Module Building Integrated Photovoltaic Arrays

As discussed herein, solar cells that are integrated as part of PV tile areas, which in turn make up flexible PV modules, can be connected together as and laid down so that they make up the main surface of a roof, and in particular, a solar roof that has the appearance and aesthetic of a uniform tile roof. By having the PV tile areas individually contain solar cells, because the PV tile areas form part of the roof through the PV modules, advantages can be obtained in comparison to traditional "over-roof" arrays that are slightly elevated from the surface of a roof. For example, roof surfaces formed of PV modules that are directly built onto the framing structure of a roof can be lighter than over-roof installations, at least because the built-in BIPV solar array does not require a second structure above an existing roof. Further, a roof that is being replaced in a re-roofing installation can replace older or traditional roof tiles with PV modules (and optionally, some PV roof tiles) that may reduce the amount of materials needed for a re-roofing installation. Also, electrical connections, junction boxes, and wiring can be generally housed underneath PV roof tiles or PV modules of such BIPV assemblies, protecting such components from precipitation, wind, and excess heat, and further hiding such components from an observer so as to make the overall BIPV system visually attractive or uniform.

Designers of BIPV solar arrays generally aspire to provide for an advantage over traditional on-roof PV systems by having a less drastic topological difference, thereby reducing visually noticeable differences in height on regions of the roof. However, previous implementations of BIPV systems do not necessarily provide for further visual qualities or designs that effectively minimize noticeable differences between solar materials and standard roofing materials that form the overall PV system in the same manner as the presently disclosed system. Embodiments of the present disclosure provide for a BIPV system with solar cells contained inside individual roofing tiles and electrically connected in strings or other circuits, which is visually appealing at least in that the solar elements and roofing materials are combined and assembled in a layout that minimizes or camouflages the differences between the solar components and the standard construction materials.

A part of the advantage of the present system is that the process implements much of the straightforward nature of laying a tile roof, but accounting for PV elements on flexible modules (within individual PV tiles areas) and making electrical connections between the solar cells on PV modules, requires only minimal additional work and training. In addition to being faster to install than single tile modules, having built-in flexibility between individual tile portions in an N-tile portion PV module allows for variations in roof planarity to be compensated for. A rigid PV module composed of N interconnected tile portions would propagate any such variations through the installation and result in an visually uneven installation.

A BIPV tile roof as considered herein is mounted in generally the same manner as a standard tile roof, for example: securing and sealing underlayment or other sheathing to frame elements of the roof, adding battens as needed to portions of the roof frame, installing modules and/or tiles to form the main surface of the roof, working around obstacles (e.g., chimneys, skylights, vents, etc.) as needed, and installing ridge and edge tiles in combination with flashing or other trim structures of the roof. Each PV module further includes respective V+ and V− power outputs for connecting to other electrical component of a solar roof. In the present system, the PV modules must have a structural integrity capable of accommodating and supporting PV elements within the tile areas, in terms of weight, heat generated, ability to connect electronics, and retaining strength to serve as a portion of a roof surface. The modules and tiles used can be of standard sizes as known in the industry. Further, modules and tiles used for systems considered herein can have a wide range of colors to match or blend with PV elements, including, but not limited to, blue, blacks, grays, browns, and natural clay colorations. It is understood that these same advantages can be applied to shingle roofs, with a corresponding PV module shaped to match shingles instead of tile.

In many aspects, embodiments of the present disclosure are directed to flexible PV modules that have three regions that approximate or are functionally similar to three separate PV tile areas. As part of a PV array, for example on a roof, rows and courses of such PV modules can look like rows of separate PV roof tiles, and indeed, such an aesthetic is desirable. For flexible PV modules considered herein having three PV tile areas, such PV modules can alternatively be referred to as "three-tile" modules, "series triple" modules, or the like.

All of the sets of solar cells that are part of the PV modules must be electrically connected to each other across the PV tile areas. There are two approaches considered herein to doing so: the first is a ribbon wire connection between the solar cells, and the second is a foil joint connection between the solar cells, described in further detail below.

Figure 2:
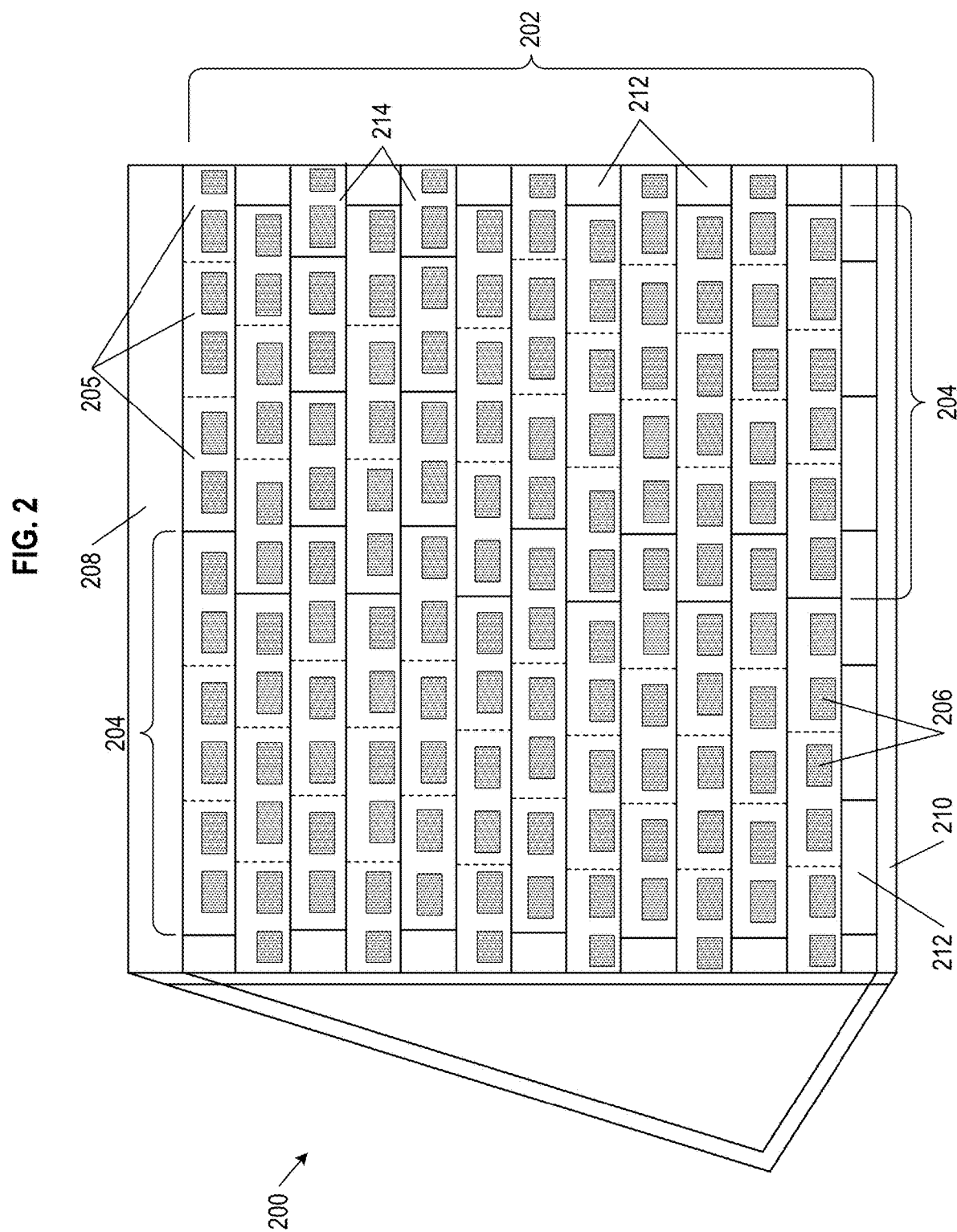
FIG. 2 shows a schematic of a portion of a building integrated photovoltaic system having flexible photovoltaic modules, in accordance with embodiments of the disclosure.

FIG. 2 shows a schematic of exemplary BIPV system 200 installed over a roof plane as part of roof surface 202, and constructed from PV modules 204. BIPV system 200 is arranged from PV modules 204 in horizontal rows or courses along the length of roof surface 202. Each PV module 204 in exemplary BIPV system 200 includes three PV tile areas 205, where each PV tile area 205 includes two solar cells 206. Each PV module 204 has an appearance that simulates or replicates the appearance of three individual adjacent PV roof tiles. The separation between PV tile areas 205 on PV modules 204 and between adjacent modules can mimic the width and appearance of seams or breaks that would exist between adjacent conventional roof tiles. In other words, inter-tile gap between individual tile areas in PV module 204 may be set to mimic the distance between adjacent modules 204 so that the array appears to be composed entirely of individual roof tiles. Also, vertically adjacent courses of PV modules 204 can be offset from each other by the half the width of a tile area such that the apparent seams or breaks between two vertically adjacent rows of PV modules 204 do not form the appearance of a single seam or break along the full slope of roof surface 202 as is commonly done with conventional non-solar roof tiles. Rather the vertically adjacent rows of PV modules 204 can form an alternating pattern of seams, where breaks between adjacent PV modules 204 are relatively equidistant from each other. Roof surface 202 further includes ridge flashing 208 at the top of roof surface 202 and eave flashing 210 at the bottom of roof surface 202.

Flashing 208 may conceal wires, roof/batten connections of the top course of PV tiles 204, and also provide for ventilation under the array.

Roof surface 202 can further include other roofing elements, such as traditional roof tiles 212 or individual PV roof tiles 214, which can be used and placed within the overall roof surface 202. In some aspects, individual PV roof tiles 214 can be used to fill gaps between PV modules 204, to finish off ends of rows or courses of PV elements close to the edge of roof surface 202, or to otherwise accommodate and connect portions of a PV array on the roof surface where PV modules 204 do not fit or would not be ideal for the BIPV system. In other aspects, traditional roof tiles 212 can be used to finish off ends of rows or courses of PV elements close to the edge of roof surface 202, to cover spaces between PV elements of the roof surface and flashing or trim components of roof surface 202 (e.g., the most down-roof course of tiles as shown in FIG. 2), or for sections of roof surface 202 where the tile needs to be cut to accommodate other roof structures (e.g., vents, chimneys, etc.) and thus cutting PV roof tile 214 or PV module 204 would be an inefficient use of materials. In various embodiments, to speed installation, traditional roof tiles 212 may also be formed into N-tile modules where N is an integer greater than 1.

Several different types of PV modules 204 (and/or PV roof tiles 214) can be used with roof surface 202 as considered herein. PV modules 204 (and/or PV roof tiles 214) can be made of materials including, but not limited to: stone, quartz, slate, granite, ceramics, concrete, porcelain, rigid shingle, clay, glass, onyx, or replica materials for the same. PV modules 204 can have a shape that is generally rectangular, optionally having rounded corners, sharp corners, smooth edges, notches along the edges, in various combinations, and the like. The edges of PV modules 204 can further be beveled, chamfered, rounded, right-angled, or the like. PV modules 204 having one side longer than another side can be oriented either with the longer edge of PV modules 204 generally parallel to the width dimension roof surface 202 or with the shorter edge of roof tile 204 generally parallel to the width dimension roof surface 202. Generally, PV modules 204 considered for use herein are substantially planar in geometry, but in other embodiments PV modules 204 can be configured to mimic shapes that include, but are not limited to: curved tiles, barrel tiles, s-shaped tiles, Spanish tiles, tiles shaped to be used on the edges of a roof, or tiles shaped to interlock with adjacent tiles. In further alternative embodiments, PV modules 204 can have a size and weight similar to roof shingles and can have a striated or contoured top surface formed directly in the top layer of glass. All PV modules 204 considered herein can be formed with lapping tabs or features extending past the perimeter of the top surface, or without excess trim or material extending from a bottom plane or surface of PV modules 204.

Each PV module 204 as shown in BIPV system 200 shows two solar cells 206 in the "reveal" portion of each tile area 205, effectively spanning the width of each PV module 204, the reveal portion being the section of PV modules 204 that are exposed to sunlight as part of a roofing installation. Generally, an upper or header portion of the top surface of PV modules 204 in BIPV system is a "lapped" or "overlap" region and, as part of a roofing installation, will be physically covered or underneath bottom surfaces of PV modules 204 (or other roofing components) of the next adjacent, up-roof course of PV modules 204.

Solar cells 206 are embedded or adhered to PV modules 204 that are essentially frameless or have a minimized frame structure so that PV modules 204 are both the structural substrate and frame for solar cells 206. In some aspects, solar cells 206 can have electrical contacts in a frame section, but this is optional.

BIPV system 200 shown in FIG. 2A includes PV modules 204, PV roof tiles 205, and standard (traditional, non-PV) roof tiles 210 which form a structural envelope for roof surface 202. Viewed together, these PV modules that form BIPV system 200 reduce the complexity inherent in conventional PV systems installations while providing a uniform look and appearance. BIPV system 200 achieves a combined function of forming structurally sound roof surface 202 as well as a solar energy collecting circuit.

Other aspects of roof surface 202 can interface with BIPV system 200 to form a satisfactory roof. For example, ridge flashing 208 can include a ridge cap at the top of the resultant BIPV array, and may be used for venting, heat dissipation, wire management, and to generally conceal and protect wires (e.g., conduits or cables) or other equipment (e.g., fans, vents, connectors, inverters, jumpers, home-run connections). Waterproofing components, such as liners or trim, can be set underneath or between PV modules, PV tiles, and/or standard roof tiles such that roof surface 202 properly functions as a roof to prevent water from entering the structure of the building. BIPV system 200 can also include other roofing components (e.g., flashings, gutters, vents, caps, covers, trims), for example, at eave flashing 210, hips, valleys, or sides of the roof (not shown).

In some aspects, PV modules 204 supporting or embedded with solar cells 206 can be specifically configured to accommodate electrical junction boxes or micro-inverters on each individual PV modules 204, located on the bottom surface (underside) of PV modules 204. Wiring, cables, and/or power buses to electrically connect PV modules 204, and by extension solar cells 206 on within PV tile areas 205, can string together a plurality of PV modules 204. To avoid interference with underlying studs, rafters, joints, battens, buttresses, or other infrastructure of a roof, such electrical components can be attached to the underside of PV modules 204 in locations to avoid physical conflicts with battens or other structure. In combination or alternatively, non-PV roof tiles 210 that do not include electrical connectors or components on their underside can be used in locations where such electrical connectors would otherwise physically conflict with underlying roof infrastructure.

A string of PV modules 204 can be electrically connected together as a subset circuit to achieve a specific or desired number of solar cells as part of the array. Such subset circuits can have a specific number of solar cells to build to a desired voltage or kilowatt production. For example, a subset circuit of electrically connected PV modules 204 can have six (6) solar cells 206, twelve (12) solar cells 206, eighteen (18) solar cells 206, twenty-four (24) solar cells 206, thirty (30) solar cells 206, thirty-six (36) solar cells 206, or any incremental number of solar cells 206 within or greater than that numerical range. These exemplary subset circuits consider configurations with solar cells 206 increasing by multiples of six, due to the exemplary arrangement of three PV tile areas 205 with two solar cells 206 each on individual flexible PV modules 206. It should be appreciated, however, that further embodiments could have PV modules 204 with other number-of-solar-cell embodiments above, below, or within the above-considered increments. For example, a subset circuit can include one or two PV roof tiles with less than six solar cells 206 electrically connected as part of the subset circuit. The various embodiments of strings with different numbers of solar cells allows for flexibility in selecting solar panels appropriate for any given system installation. By extension, subset circuits can alternatively have more solar cells 206 to build to higher voltage and kilowatt levels, for example having 42-cell, 48-cell, 54-cell, 60-cell, 66-cell, 72-cell, 78-cell, or 84-cell embodiments, or other incremental numbers of solar cells 206 therein.

The combination of these elements above for BIPV system 200, primarily using PV modules 204, can provide for an overall roof appearance that is visually pleasing, with minimal points of contrast or sharp edges to distract the eye of an observer. The clear aesthetic advantage includes the fact that roof surface 202 has a consistent visual appearance and does not look choppy or discontinuous.

It should be understood that in these embodiments, roof pitches where such systems are installed are non-zero, and that the systems are installed to account for the angle or slope of (non-flat) roofs. The distances or gaps between various tiles, rows, courses, or assemblies thereof, and the degree to which such gaps are concealed will be dependent on roof pitch, the roof dimensions, the distance a viewer is from the roof, and the height of the viewer.

FIG. 3 shows exemplary flexible photovoltaic module 300, having module frame 301, three PV tile areas 305a, 305b, and 305c, and two flexible joint regions 307. In various embodiments, module frame 301 is made from injected molded plastic or other suitable lightweight, durable and electrically insulating material (e.g. expanded polyethylene). In some aspects, module frame 301 can include cut-out sections to accommodate or set a boundary around each PV tile area 305a/305b/305c.

Specifically, first PV tile area 305a is shown on the left side of flexible photovoltaic module 300, adjacent to second PV tile area 305b with flexible joint region 307 in between these PV tile areas. Similarly, third PV tile area 305c is shown on the right side of flexible photovoltaic module 300, adjacent to second PV tile area 305b (an on the opposite side of second PV tile area 305b as compared with first PV tile area 305a) with a separate flexible joint region 307 in between these PV tile areas. Second PV tile area 305b can be considered as the center region of flexible photovoltaic module 300. Both flexible joint regions 307 can connect adjacent pans or portions of flexible photovoltaic module 300, and both flexible joint regions 307 can accommodate the inter-module cell-to-cell electrical connection formed by embodiments of flexible photovoltaic module 300 having either ribbon wire or foil joint connections electrically connecting solar cells 306. In alternative aspects, flexible photovoltaic module 300 can have a subset of flexible joint interfaces that are ribbon wire and a subset of flexible joint interfaces that are foil joint connections.

Each PV tile area 305a/b/c shown in FIG. 3 is configured to receive and support two solar cells 306. Spanning over solar cells 306 are bus bars 309 which receive electrical current from solar cells 306. It should be appreciated that although conventional solar cells are shown in FIG. 3, various embodiments of the invention may utilize shingled cells or even sections of thin film solar. The various embodiments of the invention are not tied to any particular solar cell technology. As shown in FIG. 3, bus bars 309 can span across all solar cells 306 within flexible photovoltaic module 300, passing underneath or through flexible joint regions 307. Bus bars 309 can also connect with electrical bus pairs or other electrical connection elements for joining flexible photovoltaic module 300 to a circuit, to output the power generated and collected by solar cells 306. Though not visible in the Figure, conventional cells 306 typically include many smaller conductors known as "fingers" that provide a conductive current path to the bus bars.

In alternative implementations, solar cells 306 in PV tile areas 305a/b/c can be electrically connected across flexible photovoltaic module 300 with individual ribbons, or bus bars soldered to the individual ribbons, without passing through flexible joint regions 307 adjacent to cells 306, such as, for example, within the header (overlap) portion of frame 301. In some aspects, PV tile areas 305a/b/c can be separated with a partial or complete gap or cut between cell portions of adjacent PV tile areas, without an electrical connection between the adjacent sections in the cut or gap. Conductive ribbons or leads can be set or projected upwards into the header (overlap) region of frame 301, and can further include V+ and V- bus line running the length of flexible photovoltaic module 300. Such bus line connections can be arranged to wire the power output of flexible photovoltaic module 300 in a serial or parallel manner, in order to achieve a desired or target voltage or current, as appropriate.

Figure 4A:
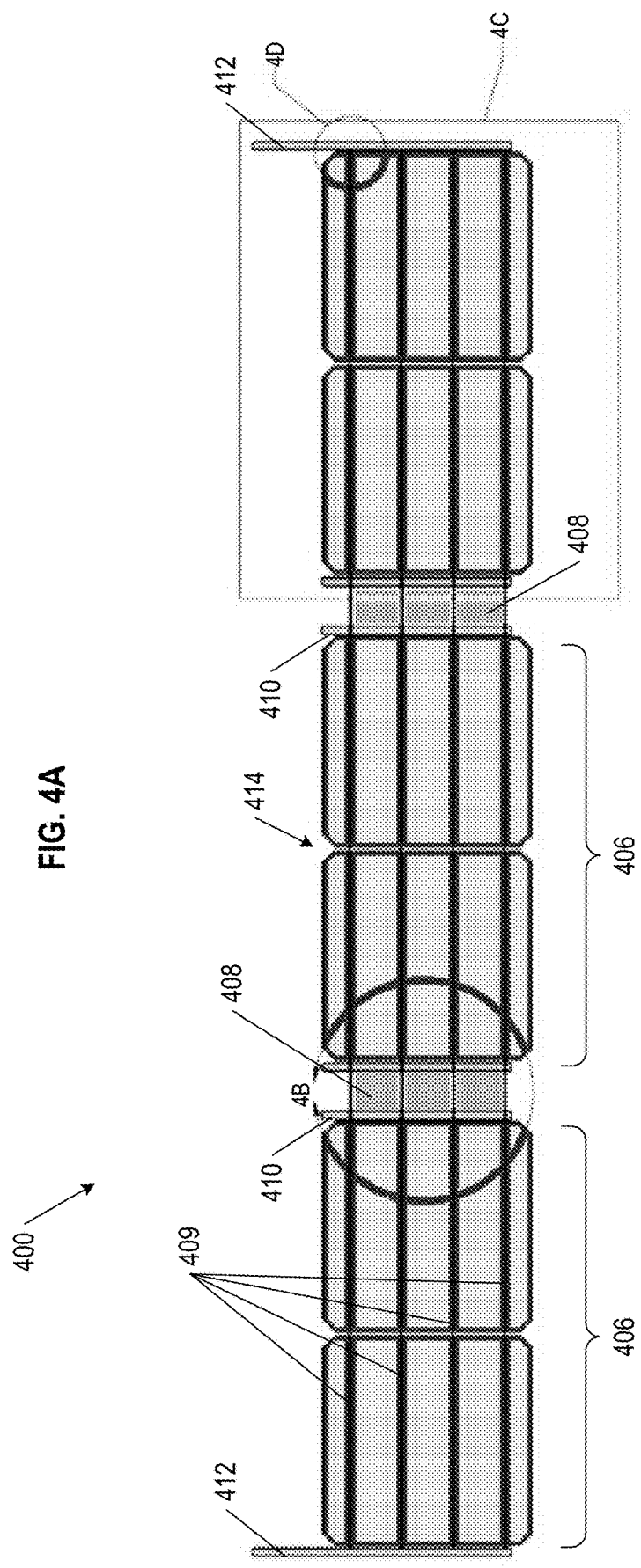
FIG. 4A shows an exemplary set of solar cells connected via ribbon wire, and configured for use as part of a flexible photovoltaic module, in accordance with aspects of the disclosure.

FIG. 4A is a partial cut-away view of an exemplary PV module according to various embodiments of the invention. In FIG. 4A, top and bottom protective layers and frame 301 have been removed to more clearly illustrate electrical interconnections within the module. FIG. 4 shows exemplary set of interconnected solar cells 400. In the embodiment of FIG. 4, ribbon wire in region 408 interconnects pairs of solar cells 406 from one solar area to the adjacent solar area, configured for use as part of a flexible photovoltaic module. Ribbon wire 408 connects paired solar cells 406, spanning the gaps between adjacent paired cells. Ribbon wires 408 are electrically and structurally connected to local bus bars 410, with the local bus bars 410 being located on interior edges of adjacent solar cells 406 within a flexible photovoltaic module. In contrast, outlet bus bars 412 can be located on the outer edges of set of solar cells 400, having a length and being configured to extend away from paired solar cells 406, so as to connect as part of a circuit with other parts of a PV array or system. Conductive bus bars 409 span across solar cells 406 and can also be in electrical communication with ribbon wire 408, local bus bars 410 and/or outlet bus bars 412. In such embodiments, the use of ribbon wires is preferable, as compared to braided wire, in order to maintain a more even and flatter profile for set of solar cells 400 and the flexible photovoltaic module in which solar cells 406 are supported. The shape of solar cells 406 can be generally square or rectangular, having chamfered corners, such that two solar cells 406 positioned next to each other can have notch region 414 between the two structures.

In some aspects, ribbon wire 408 can be positioned symmetrically between adjacent solar cells 406, centered between or equidistant from an upper (up-roof) edge and a lower (down-roof) edge of solar cells 406. In other aspects, ribbon wire 408 can be positioned biased closer to either an upper edge or a lower edge of adjacent solar cells 406.

Figure 4B:
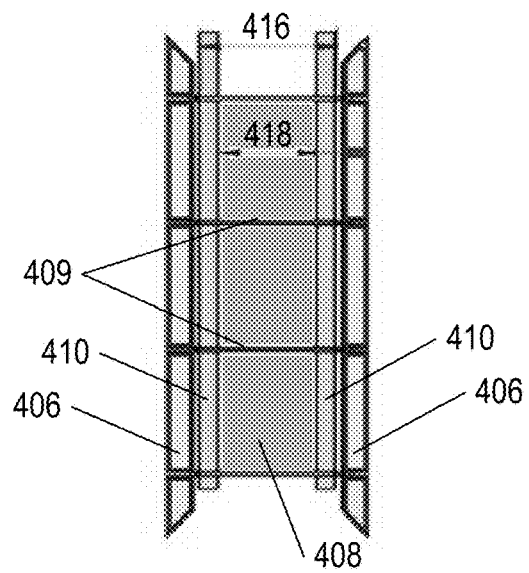
FIGS. 4B, 4C, and 4D shows detail views of portions of the set of solar cells connected via ribbon wire as shown in FIG. 4A.
Figure 4C:
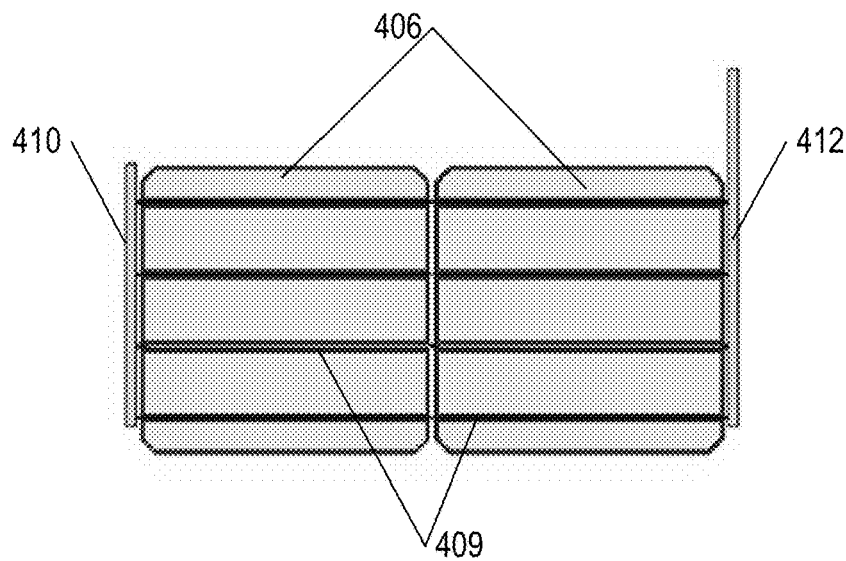
Figure 4D:
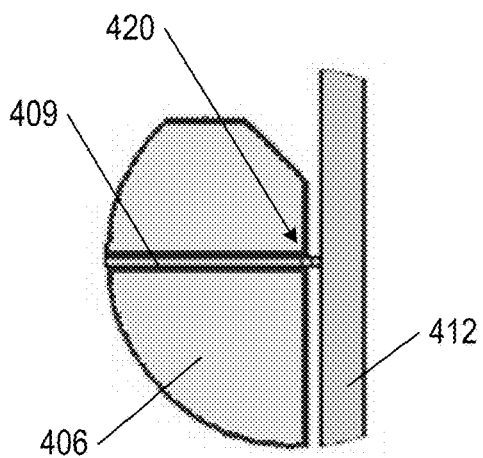

FIGS. 4B, 4C, and 4D show detail views of a portion of set of solar cells 400 connected via ribbon wire 408, as identified in FIG. 4A. Detail section 4B from FIG. 4A, shows further detail of ribbon wire 408 connection connected to local bus bars 410, and thereby electrically and structurally connected to solar cells 406. In various embodiments, ribbon wire 408 may be soldered to local bus bars 410 using heat, ultrasonic waves, RF waves or other soldering technique. Ribbon length 416 is shown as extending from the edge of one local bus bar 410 proximate to a respective solar cell 406 to the edge of the opposing local bus bar 410 proximate to its respective solar cell 406. In some aspects, the length of ribbon wire 408 spanning this distance can be 42.5 mm±3.0 mm. In other aspects, ribbon wire 408 can be up to about 70.0 mm long. Gap 418 is shown, being the distance between local bus bars 410 spanned by ribbon wire 408. In some aspects, gap 418 can be 30.5 mm±2.0 mm wide. In other aspects, gap 418 can be up to about 80.0 mm wide.

FIG. 4C is a close-up view of section 4C from FIG. 4A, showing the difference in the length between bus bars as part of set of solar cells 400, and particularly the use of local bus bars 410 versus outlet bus bars 412. The use of local bus bars 410 or outlet bus bars 412 can depend on the position of adjacent solar cells 406 to which selected bus bars are connected to within a flexible photovoltaic module. In other words, solar cells 406 that are in the center of set of solar cells 400 can have (relatively shorter) local bus bars 410 on either side of those solar cells, whereas solar cells 406 that are at an edge of set of solar cells 400 can have (relatively longer) outlet bus bars 412 on the side of solar cells defining the outer edges of set of solar cells 400. Here, FIG. 4C shows the right side pair of solar cells 406 from FIG. 4A, with one local bus bar 410 and one outlet bus bar 412 on either side of paired solar cells 406. In some aspects, local bus bars 410 can have a length of about 142.5 mm. In other aspects, outlet bus bars 412 can have a length of about 195.0 mm. Both local bus bars 410 and outlet bus bars 412 can have lengths of about 1000 mm, allowing for bends in the bus bars connecting different electrical elements including interconnected solar cells 400. In further aspects, both local bus bars 410 and outlet bus bars 412 can have a width of about 6.0 mm, and a thickness of about 0.3 mm. In some aspects, both local bus bars 410 and outlet bus bars 412 can be spaced a distance apart from solar cells, where this distance can be 2.0 mm±1.0 mm. Conductive bus bars 409 connecting to local bus bar 410 on the right side of solar cells 406 extend across solar cells 406 to connect with outlet bus bar 412.

FIG. 4D, is a close-up view of section 4D from FIG. 4A showing ribbon interconnects 420 extending from solar cell 406 and bus bar 409 to (in this view) outlet bus bar 412. It is understood that ribbon interconnects 420 (alternatively referred to as "electrical leads") can similarly couple solar cell 406 and bus bar 409 to corresponding local bus bars 410. Soldered ribbon interconnects 420 allow for the connection of paired solar cells 406 to adjacent bus bars. In some aspects, ribbon interconnects 420 can be about 1.3 mm long by about 0.2 mm wide.

Figure 5B:
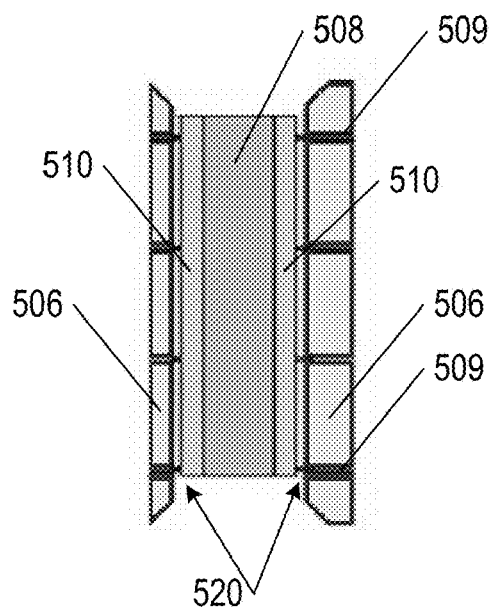
FIGS. 5B, 5C, and 5D shows detail views of portions of the set of solar cells connected via metal foil as shown in FIG. 5A.

FIG. 5A is a partial cut-away view of an exemplary PV module according to various embodiments of the invention. In FIG. 5A, top and bottom protective layers have been removed to more clearly illustrate electrical interconnections within the module. FIG. 5 shows exemplary set of solar cells 500 connected via metal foil joint 508 between pairs of solar cells 506, configured for use as part of a flexible photovoltaic module. Foil joint 508 spans the gap between adjacent pairs of solar cells 506, providing electrical connection between them. Foil joints 508 can be electrically and structurally connected directly to edges of adjacent solar cells 506 via soldering and interconnects 520 (seen in FIGS. 5B & 5D) within a flexible photovoltaic module. Foil joint 508 connecting paired solar cells 506 can be referred to as being at interior positions within a flexible PV module. In contrast, outlet bus bars 512 can be located on the outer edges of set of solar cells 500, having a length and being configured to extend away from paired solar cells 506, so as to connect as part of a circuit with other parts of a PV array or system. Bus bars 509 again span across solar cells 506 and can also be in electrical communication with foil joint 508 and/or outlet bus bars 512. The shape of solar cells 506 can be generally square or rectangular, having chamfered corners, such that two solar cells 506 positioned next to each other can have notch region 514 between the two structures, which can further aid in handling or installation of set of solar cells 500.

Foil joints 508 connecting solar cells 506 span across the gaps between paired solar cells 506 in separate PV tiles areas within a flexible PV module. A sufficiently strong and electrically conductive metal or alloy may be used to make this connection, where the metal or alloy chosen for foil joint 508 has a balance between conductivity and yield strength (a resistance to bending), while still being compatible with other PV components (such as solder) and environmental conditions (such as heat from electrical resistance or general weather). In particular embodiments, the foil can be made of copper (Cu) or copper-based, which in various aspects can be annealed copper, a beryllium (Be) copper alloy, and/or tin (Sn) coated copper. In particular embodiments, the foil can be made of aluminum (Al), a doped aluminum alloy, or aluminum-based. In various embodiments, the foil joint 508 can have a width (spanning the gap between adjacent paired solar cells 506) of 41.0 mm±1.0 mm. In some aspects, the foil joint 508 can have a length of 127.0 mm±3.0 mm. In various implementations, the metal of foil joint 508 can be from 0.1 mm to 0.4 mm thick, or at increments or gradients of thickness within that range (such as 0.2 mm or 0.35 mm).

In some implementations, foil joints 508 are further secured to edges of solar cells 506 with additional coating 510 overlaid at the edges of foil joints 508. In particular, the edges of foil joints 508 can be "tinned" to form coating 510 with a layer of tin solder, which can both add structural strength to the bond at the location where foil joints 508 connect to solar cells 506 and/or interconnects 520, and also establish the electrical connection from foil joints 508 to solar cells 506 or interconnects 520 on solar cell 506. In various implementations, coating 510 can be about 0.2 mm thick and cover 8.0 mm±4.0 mm of foil on each side of foil joint 508 (measured from the edge of foil joint 508 inward). It can be appreciated that coating 510 should be generally absent from the flex point of foil joint 508, such that foil joint 508 maintains a desired range of bending motion.

In some aspects, foil joint 508 within a gap can be positioned symmetrically between adjacent solar cells 506, centered or equidistant from an upper (up-roof) edge and a lower (down-roof) edge of solar cells 506. In other aspects, foil joint 508 within a gap can be positioned biased closer to either an upper edge or a lower edge of adjacent solar cells 506. In particular aspects, foil joint 508 can be offset toward the top edge of the string formed by solar cells 506.

In further embodiments, foil joints 508 is covered by an encapsulant material that protects against corrosion of metal foil joints 508 and deflects precipitation away from coating 510. In various aspects, such an encapsulant can be formed of materials including, but not limited to, photodefinable epoxy (PDE), enhanced polyethylene (EPE), silicone, and the like. Encapsulant materials applied over foil joints 508 can be the same or different than other encapsulant materials used to coat surfaces of solar cells 506 or to encapsulate solar cells 506 between top and bottom protective layers.

Figure 5C:
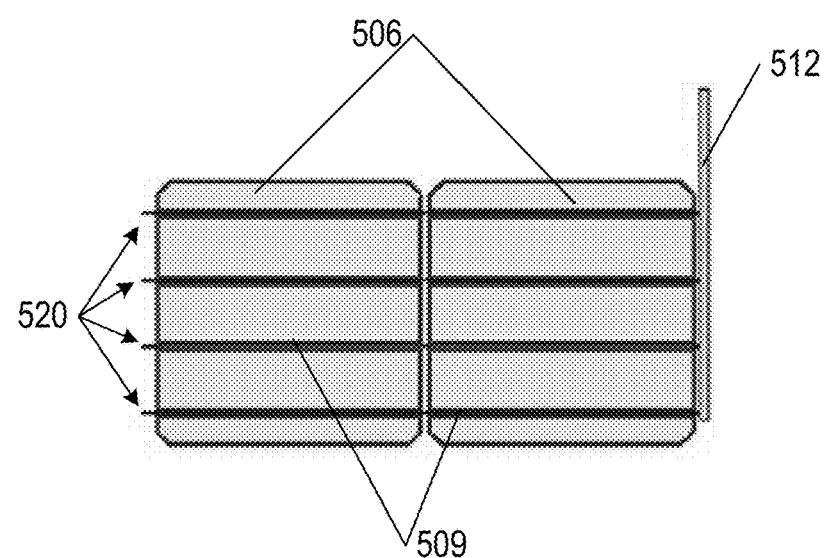
Figure 5D:
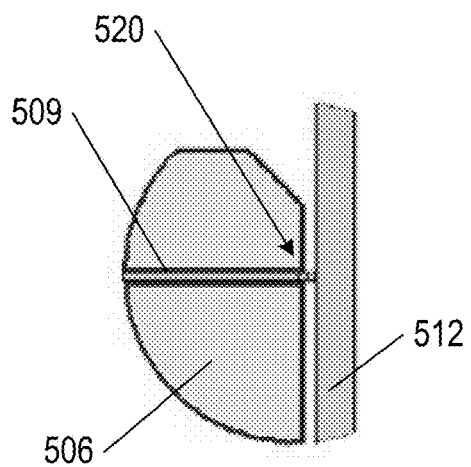

FIGS. 5B, 5C, and 5D show detail views of portions of set of solar cells 500 connected via metal foil as shown in FIG. 5A. FIG. 5B is a close-up view of section 5B from FIG. 5A, showing foil joint 508 soldered on both sides via coating 510 to adjacent solar cells 506, thereby electrically and structurally connecting to solar cells 506. Foil joint 508 is shown (partially under a layer of coating 510) as extending from the edge of one solar cell 506 to the edge of opposing solar cell 506 (again, with foil joint 508 partially under a layer of coating 510). In some aspects, where foil joint 508 is offset toward the upper edges of solar cells 506, the distance of that offset can be such that the upper edge of foil joint 508 is about 7.2 mm above the top-most bus bar 509 of set of solar cells 500. In other aspects, where foil joint 508 is offset toward the upper edges of solar cells 506, the distance of that offset can be such that the lower edge of foil joint 508 is 17.7 mm±1.0 mm from the bottom edge of solar cells 506. Further, where coating is only connected to interconnect 520, a spacing gap can exist between coating 510 and solar cell 506 which can be 2.8 mm±1.0 mm.

FIG. 5C is a close-up view of section 5C from FIG. 5A, showing the relative positioning and length of outlet bus bar 512 as part of set of solar cells 500. Here, FIG. 5C shows the right side pair of solar cells 506 from FIG. 5A, with one outlet bus bar 512 on a far right side of paired solar cells 506. In some aspects, outlet bus bars 512 can have a length of about 195.0 mm, a width of about 6.0 mm, and a thickness of about 0.3 mm. Bus bars 509 connecting to interconnects 520 on the left side of solar cells 506 extend across solar cells 506 to connect with outlet bus bar 512.

FIG. 5D, close-up view of section 5D from FIG. 5A, shows further detail of interconnects 520 extending from solar cell 506 and bus bar 509 to (in this view) outlet bus bar 512. It is understood that interconnects 520 can also connect solar cell 506 and bus bar 509 to edges of foil joints 508, optionally via coating 510. In some aspects, interconnects 520 can be about 1.3 mm long by about 0.2 mm wide.

In both embodiments of flexible PV modules considered herein, implementing flexible joints with either ribbon wire or with foil joints, the flexible joints must have sufficient resilience and operational lifespan to withstand expected strain, fatigue, and stress of the PV modules. In particular, flexible PV modules are expected to endure physical stressors with the flexible joints providing for slack and relief of load or tension resulting from physical stressors. Such physical stressors can include, but are not limited to bending: during transport, from being walked on during installation, wind shear and lift as part of an installed solar array, weight of other physically connected solar array components, thermal expansion and contraction, and combinations thereof. The ability of the flexible joints to alter and then restore shape can be considered a cyclical motion, where the flexible joint has a defined strain-life (alternatively referred to as fatigue or stress-limit).

For metal foil flexible joint embodiments, the foil is configured to balance electrical conductivity with resilience to repeated, cyclical physical strains. In some aspects, foil joints as disclosed herein maintain their structural integrity and functional conductivity for at least 30,000 cycles of 5° bends. In other aspects, foil joints as disclosed herein maintain their structural integrity and functional conductivity for at least 1,000 cycles of 15° bends.

Ribbon wire flexible joint embodiments also seek to balance electrical conductivity with resilience to repeated, cyclical physical strains. In some aspects, ribbon wire joints as disclosed herein maintain their structural integrity and functional conductivity for at least 30,000 cycles of 5° bends. In other aspects, ribbon wire joints as disclosed herein maintain their structural integrity and functional conductivity for at least 1,000 cycles of 15° bends.

Figure 6A:
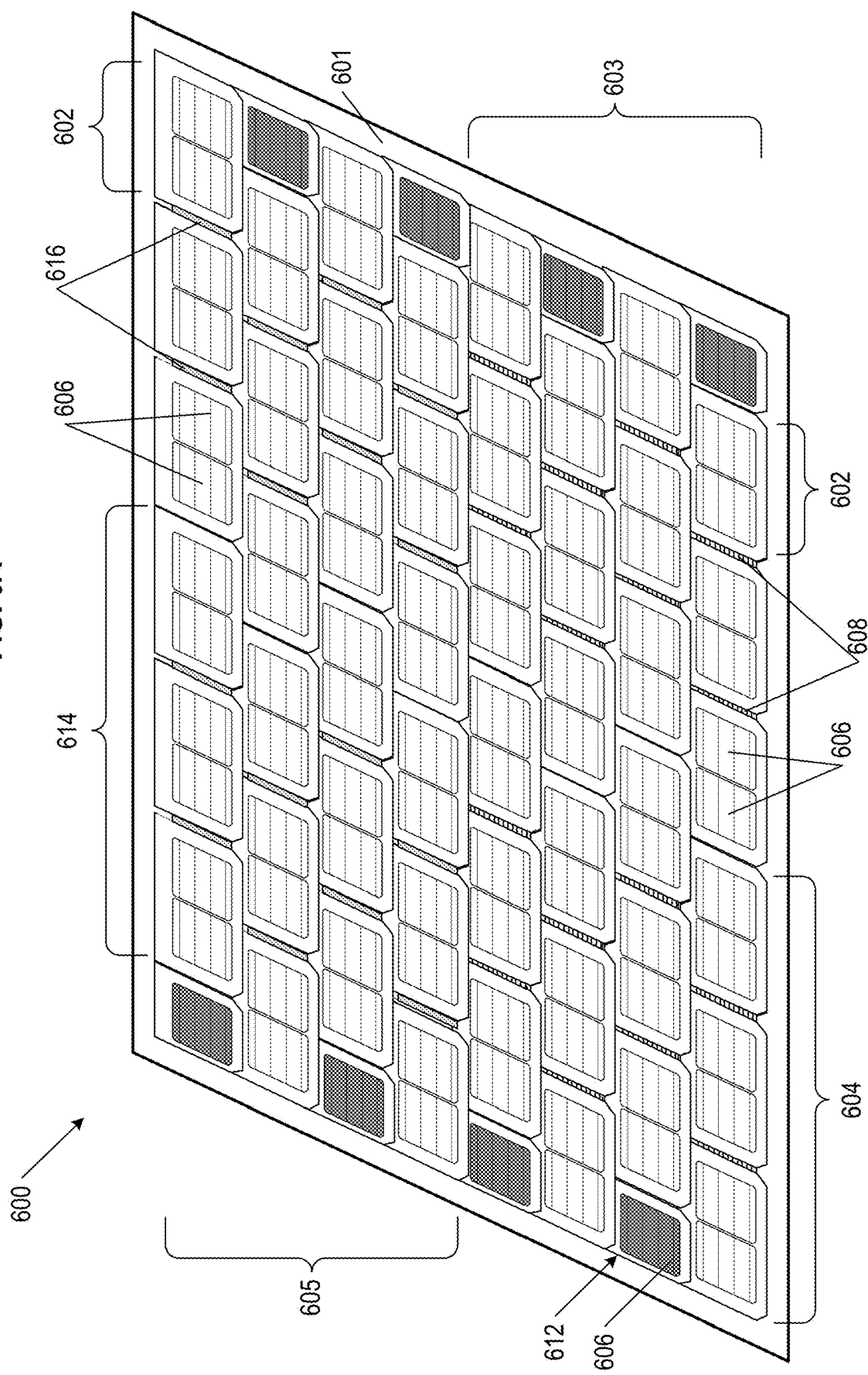
FIG. 6A shows an exemplary schematic of a photovoltaic array, having courses of both flexible photovoltaic modules with solar cells connected via ribbon wire and photovoltaic modules with solar cells connected via metal foil, in accordance with embodiments of the disclosure.

FIG. 6A shows exemplary schematic of PV array 600 formed of flexible PV modules 604, 614 and PV roof tiles 612, mounted to be part of underlying roof structure 601 according to various embodiments of the invention. PV array 600 includes courses of two types of flexible PV modules, ribbon PV modules 604 with solar cells 606 connected via ribbon wire 608, and metal foil PV modules 614 with solar cells 606 connected via foil joints 616. A roofing system using either or both of ribbon PV modules 604 and metal foil PV modules 614 will generally seek to optimize the distribution of the flexible PV modules on underlying roof 601, and can use single non-PV roof tiles 612 to fill in gaps or edges of the overall PV array 600 or system.

As seen in FIG. 6A, three down-roof courses 603 are primarily formed of ribbon PV modules 604, while in contrast, three up-roof courses 605 are primarily formed of metal foil PV modules 614. Individual non-PV roof tiles 612 are used in both down-roof courses 603 and up-roof courses 605 to fill out and finish the ends of those rows, where a PV module would be too wide for the available remaining space on the underlying roof 601. Both ribbon PV modules 604 and metal foil PV modules 614 include PV tile areas 602 in which solar cells 606 are located. Non-PV roof tiles 612 may also include solar cells 606 or other like materials to create a uniform visual appearance with PV modules 604/614. It is understood that PV array 600 could also be constructed entirely either from ribbon PV modules 604 or metal foil PV modules 614, as appropriate to any given installation or underlying roof 601.

Figure 6B:
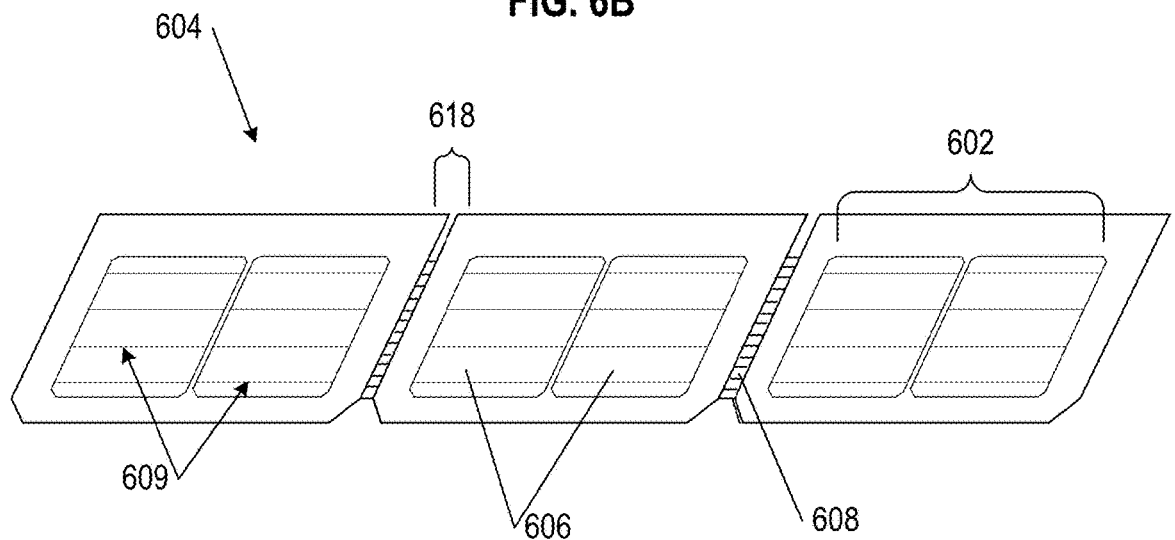
FIG. 6B shows an exemplary flexible photovoltaic module with solar cells connected via ribbon wire as shown in FIG. 6A, in accordance with embodiments of the disclosure.

FIG. 6B shows exemplary ribbon PV module 604 as shown in FIG. 6A in further detail. Ribbon PV module 604 includes solar cells 606 having bus bars 609 extending across the surface of solar cells 606. Solar cells 606 are positioned within each PV tile area 602 of ribbon PV module 604. As shown, ribbon PV module 604 includes three PV tile areas 602, each supporting two solar cells 606. Ribbon wire 608 is located at flexible joints 618 between each PV tile area 602, structurally and electrically connecting solar cells 606 within each PV tile area 602, and further allowing for a degree of bending and flexibility. It can be appreciated that ribbon PV module 604 can include more than three PV tile areas 602 (with corresponding flexible joints 618), and further that each PV tile area can be configured to accommodate different numbers or different sizes of solar cells 606. Ribbon PV module 604 further includes electrical outlet connections (not shown) such that ribbon PV module 604 can connect to a larger circuit an PV array. Optionally, ribbon PV module 604 can also include micro-inverters or junction boxes (not shown) on the underside of ribbon PV module 604 to control and regulate power flow to and from solar cells 606 within ribbon PV module 604.

Figure 6C:
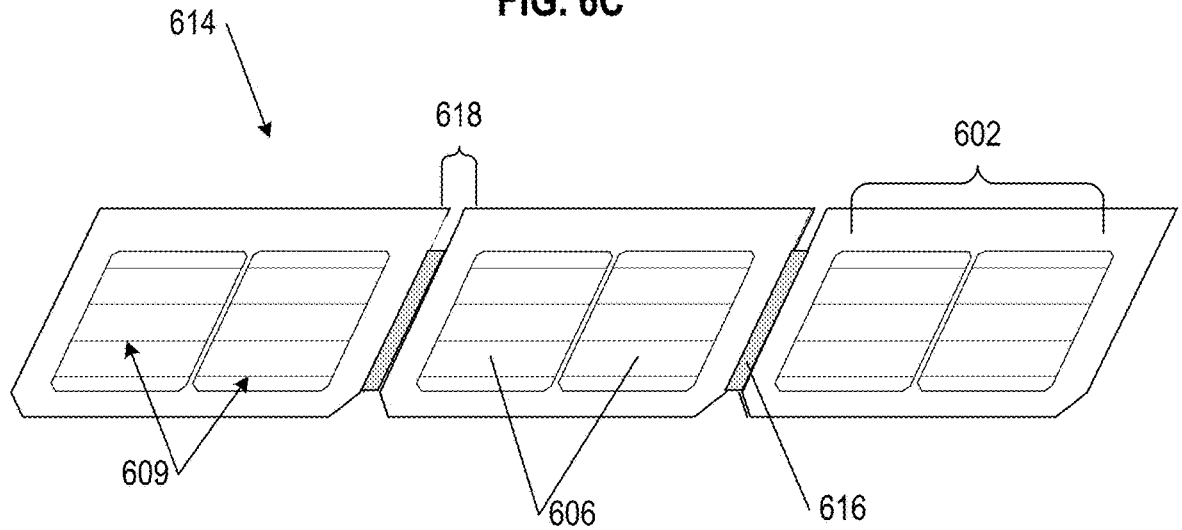
FIG. 6C shows an exemplary flexible photovoltaic module with solar cells connected via metal foil as shown in FIG. 6A, in accordance with embodiments of the disclosure.

FIG. 6C shows exemplary metal foil PV module 614 as shown in FIG. 6A in further detail. Metal foil PV module 614 includes solar cells 606 having bus bars 609 extending across the surface of solar cells 606. Solar cells 606 are positioned within each PV tile area 602 of metal foil PV module 614. As shown, metal foil PV module 614 includes three PV tile areas 602, each supporting two solar cells 606. Foil joints 616 are located at flexible joints 618 between each PV tile area 602, structurally and electrically connecting solar cells 606 within each PV tile area 602, and further allowing for a degree of bending and flexibility. It can be appreciated that metal foil PV module 614 can include more than three PV tile areas 602 (with corresponding flexible joints 618), and further that each PV tile area can be configured to accommodate different numbers or different sizes of solar cells 606. Metal foil PV module 614 further includes electrical outlet connections (not shown) such that metal foil PV module 614 can connect to a larger circuit of a PV array. Optionally, metal foil PV module 614 can also include micro-inverters, DC optimizers, junction boxes, wiring, and/or electrical connectors (not shown) on the underside of metal foil PV module 614 to control and regulate power flow to and from solar cells 606 within metal foil PV module 614.

While the schematic implementation of FIG. 6A shows horizontal rows and courses of flexible PV modules, it is also contemplated that vertical columns using this innovation may be made with advantageous water-resistant characteristics. Further, while flexible PV modules are generally flat, or restore to a generally flat configuration, when installed as part of a solar array, barrel-shaped tiles, Spanish tiles, and/or s-tiles may also be constructed as modules and used to support solar cells and form solar arrays with correspondence aesthetics. Further, terminal boxes or minor electrical boxes can be arranged underneath the courses of flexible PV modules, in order to electrically connect and regulate the overall solar array. In some installations, it may be necessary to further include a rapid shutdown device (RSD) as part of the string, to ensure that the solar array is code compliant as needed.

Figure 7B:
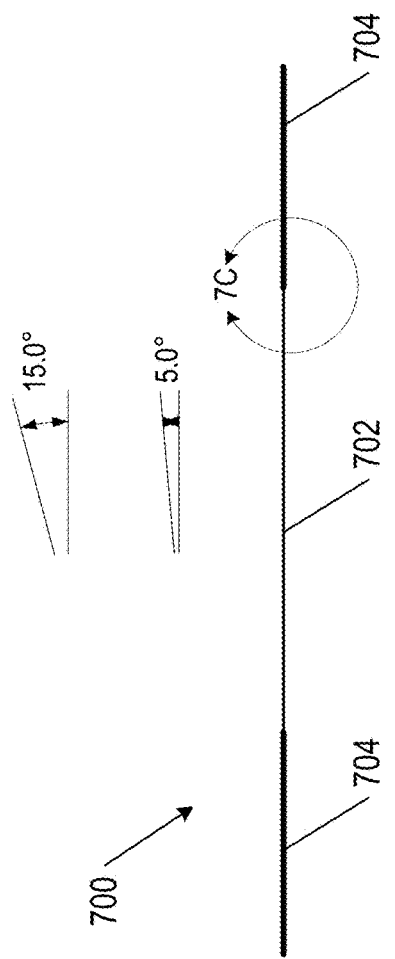
FIG. 7B shows a cross sectional illustration of the conductive metal foil connection between two adjacent solar cells in an exemplary flexible photovoltaic module as shown in FIG. 7A.
Figure 7C:
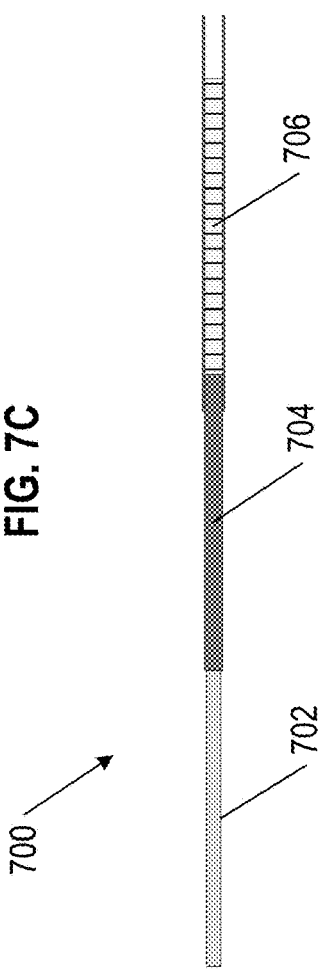
FIG. 7C is a detail schematic illustration of the interface between the conductive metal foil and a solar cell as shown in FIG. 7B.
Figure 7A:
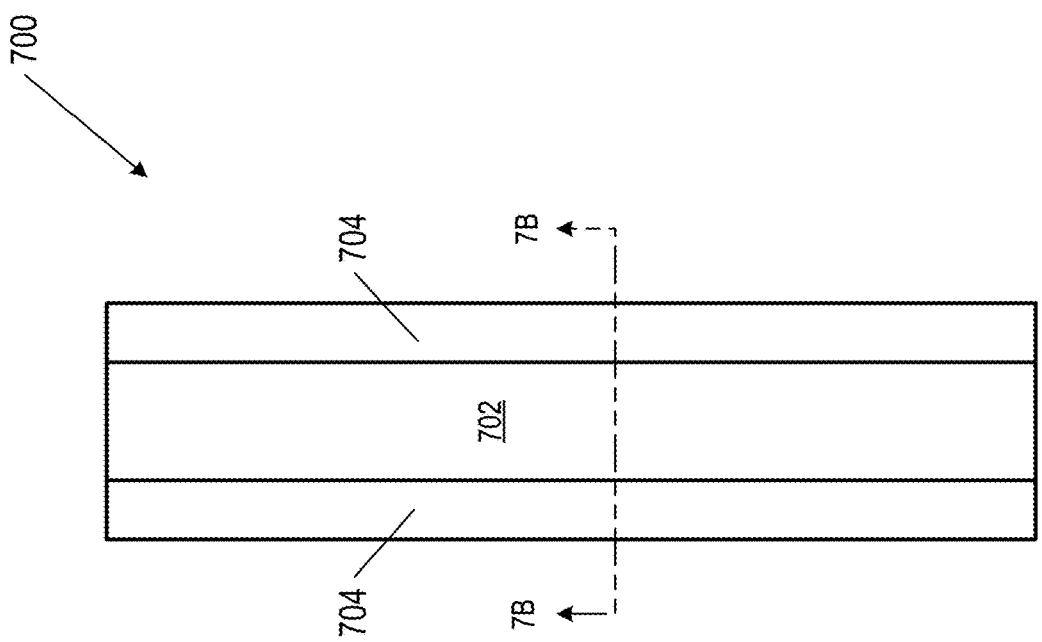
FIG. 7A shows a schematic illustration of a conductive metal foil connection between two adjacent solar cells in an exemplary flexible photovoltaic module, in accordance with aspects of the disclosure.

Focusing further on the foil joint embodiment of the present disclosure, FIG. 7A shows a schematic illustration of conductive metal foil connection 700 configured to connect two adjacent solar cells, spanning the gap between adjacent tile sections within the same PV module. Conductive metal foil connection 700 includes conductive foil 702 having two coated regions 704 along the full length of conductive foil 702. In various aspects, conductive foil 702 is a copper or copper-based alloy foil. In other aspects, coated regions 704 applied to longitudinal edges of conductive foil 702 can be soldering, and in particular tin-based solder. In further aspects, additional coatings can be applied on top of conductive foil 702 and/or coated regions 704, where an additional coating can be an encapsulant, a dielectric, or both an encapsulant and a dielectric. In the exemplary illustration of FIG. 7A, conductive metal foil connection 700 can have a length of about 127.0 mm and a width of about 33.5 mm (inclusive of the coated regions 704).

FIG. 7B shows a cross sectional illustration of conductive metal foil connection 700, as taken along the line 7B as shown in FIG. 7A. The relative thicknesses of conductive foil 702 and coated regions 704 can be appreciated in this view. In the exemplary illustration of FIG. 7B, conductive metal foil coated regions 704 can each cover conductive foil 702 a distance of 8.0 mm±2.0 mm from each longitudinal edge of conductive foil 702. For reference, also illustrated are the relative degrees of flexibility, of 5° and 15° as measured from a baseline "flat" (unbent and unbowed) configuration, that conductive metal foil connection 700 (forming a flexible joint) is configured to have. Of course, conductive metal foil connection 700 can also have a degree of flexibility less than 5°, or reach degrees of flexibility between 5° and 15°. In any such embodiment, however, conductive metal foil connection 700 is expected to endure repeated cyclical bending strains between 5° and 15° for the functional lifetime of the corresponding PV module.

FIG. 7C shows a detail schematic illustration of the interface between conductive metal foil 702 and solar cell 706, as taken from the section 7C identified in FIG. 7B. Here, coated region 704 is shown as covering both metal foil 702 and solar cell 706, on both upper and lower surfaces of metal foil 702 and solar cell 706. Accordingly, the material forming coated region 704, being an electrical conductor such as soldering, both structurally and electrically connects metal foil 702 and solar cell 706. In the exemplary illustration of FIG. 7C, conductive foil 702 can have a core material thickness of 0.038 mm±0.004 mm, while the thickness of coated region 704 over surfaces of solar cell 706 can be 0.020 mm±0.004 mm.

FIG. 8 is a schematic of exemplary conductive metal foil connection 800 between two solar cells 804 (within the same PV module), reflecting the embedded construction of solar cells 804 along with the electrical coupling. Metal foil 802 is covered on both upper and lower surfaces by dielectric material 806. The edges of metal foil 802 are in contact with solar cells 804, thereby forming an electrical connection between the two solar cells 804. Solar cells 804 are covered on both upper and lower surfaces by encapsulant material 808, which also partially covers dielectric material 806. In various aspects, dielectric material 806 can extend to cover a greater or lesser area of solar cells 804 than represented in FIG. 8. In other aspects, encapsulant material 808 can extend to cover a greater or lesser area of dielectric material 806 (and thus metal foil 802) than represented in FIG. 8.

Above encapsulant material 808 covering an upper surface of solar cell 804 is top glass 810. Similarly, below encapsulant material 808 covering a lower surface of solar cell 804 is backing glass 812. In some aspects, the top glass 810 and/or backing glass 812 can be a polymer. In various implementations, the amount of surface area of metal foil 802 covered by encapsulant material 808 (with dielectric material 806 in between), can affect the bending properties of the overall conductive metal foil connection 800. Specifically, with relatively less surface area of metal foil 802 joint covered by encapsulant material 808, there is a greater range and degree of bending for conductive metal foil connection 800, but a greater the risk of physical failure (e.g. tearing). Conversely, with relatively more surface area of metal foil 802 covered by encapsulant material 808, there is a greater structural strength of conductive metal foil connection 800, but a smaller available range and degree for bending.

FIG. 9 shows a set of exemplary flexible PV modules with solar cells connected via flexible joints. Each of these exemplary flexible PV modules can be understood as extensions of other flexible PV modules disclosed herein. Further, any one or all of these exemplary flexible PV modules can be using in combination with each other or other flexible PV modules disclosed herein. Specifically, module 900 is a flexible PV module having four PV tile areas having foil joints connecting its PV tile areas; module 902 is a flexible PV module having five PV tile areas having foil joints connecting its PV tile areas; module 904 is a flexible PV module having four PV tile areas having ribbon wire connecting its PV tile areas; and module 906 is a flexible PV module having five PV tile areas having ribbon wire connecting its PV tile areas.

Figure 10A:
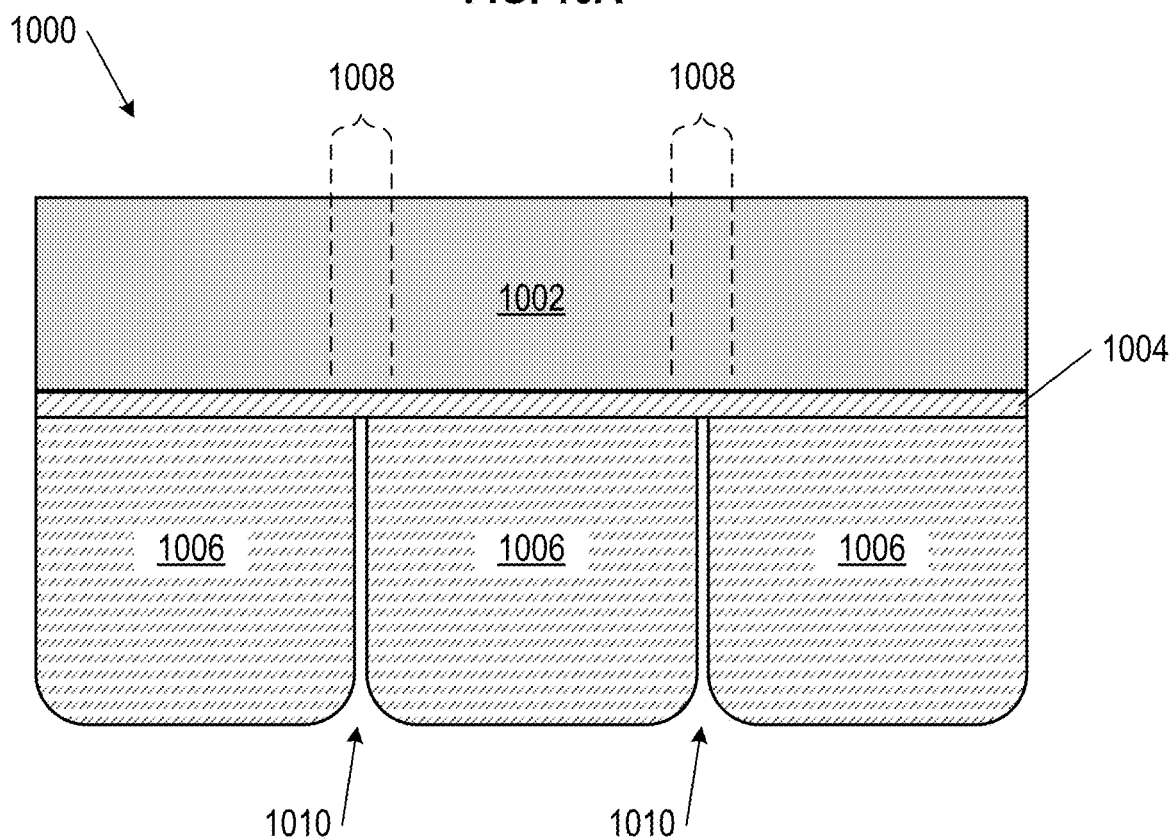
FIG. 10A shows an exemplary schematic photovoltaic module, having an electrical bus along the header of the module, in accordance with embodiments of the disclosure.

FIG. 10A shows exemplary schematic PV module 1000, having electrical bus 1004 along header 1002 of PV module 1000. In such embodiments, PV modules 1000 have connected header 1002 and electrical bus 1004 structures, but between solar cells 1006 are complete gaps 1010 without specific flexible joint structures. Rather, flexible joint regions 1008 can be positioned at locations under or within header 1002 (and electrical bus 1004) corresponding to the location of gaps 1010. In some aspects, electrical bus 1004 can be a ribbon wire or a copper foil, as described above. Accordingly, each tile section of PV module 1000 having solar cells 1006 physically connected to header 1002 in this manner can have a relatively greater degree of flexibility as compared to other flexible PV modules. Further, PV module 1000 can be relatively easier to flex or bend for installation or removal, due in part to the relatively reduced amount of material required for bending PV module 1000. In such embodiments, sidelap structures are not necessarily needed to structurally support PV module 1000. Further, in such embodiments, midlap structures can be reduced in size or length, and can be limited to the height of header 1002. In various embodiments, header 1002 may be coated with a self-sealing tar or other adhesive that will activate after module 1000 is installed and exposed to heat.

Figure 10B:
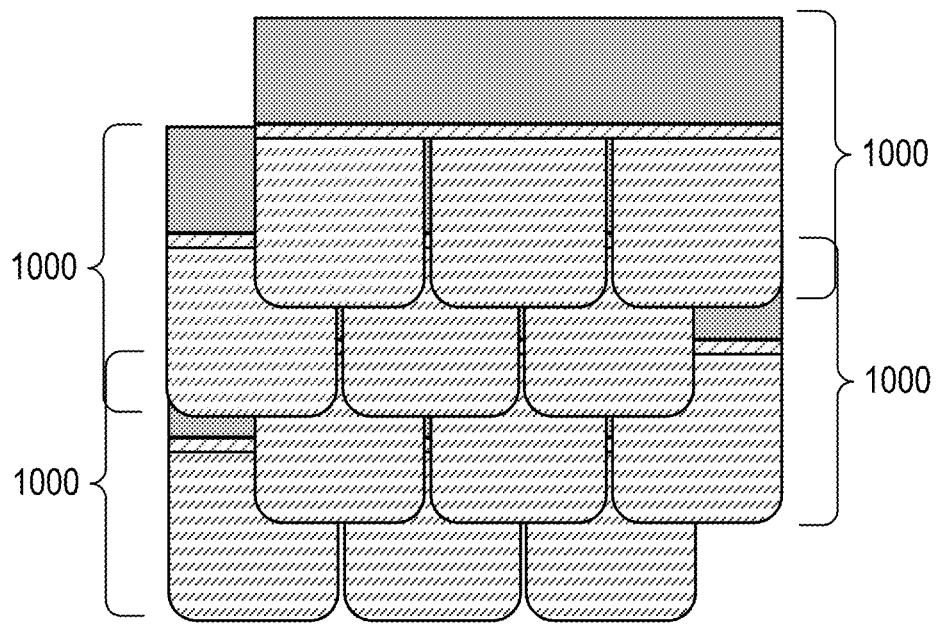
FIG. 10B shows an arrangement of photovoltaic modules as shown in FIG. 10A, arranged with overlapping coverage of electrical buses, in accordance with embodiments of the disclosure.

FIG. 10B shows an arrangement of PV modules 1000 as shown in FIG. 10A, arranged with overlapping coverage of electrical buses 1004. As shown, solar cells 1006 of PV module 1000 in a relatively up-roof course can lap over electrical bus 1004 of PV module(s) 1000 in the immediately adjacent down-roof course. Naturally, in such embodiments, electrical buses 1004 can electrically connect solar cells 1006 of PV module 1000 which they are a part of. Further, in some aspects, electrical buses 1004 can electrically connect solar cells 1006 of an immediately adjacent up-roof PV module 1000, as such (relatively up-roof) solar cells 1006 are overlapping and thus proximate to (relatively down-roof) electrical bus 1004. In addition, any water running between the gaps in adjacent tile sections 1006 or adjacent modules will be directed to the middle of an individual tile section 106 of the next down-row course of tiles obviating the need for sidelaps between adjacent modules or additional water shedding structures and/or material in the joints between adjacent tile sections.

In further alternative embodiments, PV modules as discussed herein may be inductively coupled with an underlying power mat(s) or lattice. Such an induction-based system would eliminate the need for most wiring and physical connectors. The underlying power mat(s) or lattice would be disposed on a roof deck or battens of a roof structure, and electrically coupled with minor electrical boxes or optimizers that further connect with an electrical main box. PV tiles would be arranged and secured over corresponding sections of the power mat(s) or lattice, such that the underlying power mat(s) or lattice would receive electricity collected by solar cells through induction, and subsequently convey that electricity to the minor electrical boxes and/or electrical main box.

From the foregoing, it will be appreciated that specific embodiments of the invention have been described herein for purposes of illustration, but that various modifications may be made without deviating from the spirit and scope of the various embodiments of the invention. Further, while various advantages associated with certain embodiments of the invention have been described above in the context of those embodiments, other embodiments may also exhibit such advantages, and not all embodiments need necessarily exhibit such advantages to fall within the scope of the invention. Accordingly, the invention is not limited, except as by the appended claims.

While the above description describes various embodiments of the invention and the best mode contemplated, regardless how detailed the above text, the invention can be practiced in many ways. Details of the system may vary considerably in its specific implementation, while still being encompassed by the present disclosure. As noted above, particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific examples disclosed in the specification, unless the above Detailed Description section explicitly defines such terms. Accordingly, the actual scope of the invention encompasses not only the disclosed examples, but also all equivalent ways of practicing or implementing the invention under the claims.

The teachings of the invention provided herein can be applied to other systems, not necessarily the system described above. The elements and acts of the various examples described above can be combined to provide further implementations of the invention. Some alternative implementations of the invention may include not only additional elements to those implementations noted above, but also may include fewer elements. Further any specific numbers noted herein are only examples; alternative implementations may employ differing values or ranges, and can accommodate various increments and gradients of values within and at the boundaries of such ranges.

References throughout the foregoing description to features, advantages, or similar language do not imply that all of the features and advantages that may be realized with the present technology should be or are in any single embodiment of the invention. Rather, language referring to the features and advantages is understood to mean that a specific feature, advantage, or characteristic described in connection with an embodiment is included in at least one embodiment of the present technology. Thus, discussion of the features and advantages, and similar language, throughout this specification may, but do not necessarily, refer to the same embodiment.

Furthermore, the described features, advantages, and characteristics of the present technology may be combined in any suitable manner in one or more embodiments. One skilled in the relevant art will recognize that the present technology can be practiced without one or more of the specific features or advantages of a particular embodiment. In other instances, additional features and advantages may be recognized in certain embodiments that may not be present in all embodiments of the present technology.

Any patents and applications and other references noted above, including any that may be listed in accompanying filing papers, are incorporated herein by reference. Aspects of the invention can be modified, if necessary, to employ the systems, functions, and concepts of the various references described above to provide yet further implementations of the invention.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof means any connection or coupling, either direct or indirect, between two or more elements; the coupling or connection between the elements can be physical, logical, or a combination thereof. Additionally, the words "herein," "above," "below," and words of similar import, when used in textual context of this application, refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

Although certain aspects of the invention are presented below in certain claim forms, the applicant contemplates the various aspects of the invention in any number of claim forms. Accordingly, the applicant reserves the right to pursue additional claims after filing this application to pursue such additional claim forms, in either this application or in a continuing application.

The invention claimed is:

1. A roofing photovoltaic (PV) module comprising:
   a first PV tile area comprising a first protective layer overlaying a first plurality of solar cells;
   a second PV tile area comprising a second protective layer overlaying a second plurality of solar cells;
   a third PV tile area, comprising a third protective layer overlaying a third plurality of solar cells, wherein the first, second, and third protective layers are arranged linearly to form an elongated roofing module, with the first PV tile area adjacent to the second PV tile area, and with the second PV tile area adjacent to the third PV tile area;
   a first flexible joint, electrically and structurally connecting the first PV tile area and the second PV tile area, wherein the first and second protective layers are separated by a gap and the first flexible joint spans the gap and bends to accommodate rotation of the first protective layer relative to the second protective layers within 5° measured from an unbent configuration;
   a second flexible joint, electrically and structurally connecting the second PV tile area and the third PV tile area, wherein the second and third protective layers are separated by a gap and the second flexible joint spans the gap and bends to accommodate rotation of the third protective layer relative to the second protective layer within 5° measured from an unbent configuration;
   a plurality of local bus bars, wherein a pair of the local bus bars are positioned on either side of the first flexible joint and a pair of the local bus bars are positioned on either side of the second flexible joint, adapted to electrically interconnect each of the PV tile areas into a series circuit; and
   a pair of outlet bus bars, one outlet bus bar each electrically connected to opposite ends of the series circuit, and forming respective V+ and V− power outputs,
   wherein the roofing PV module is configured for installation on a roof and the flexible joints have sufficient resilience to withstand the roofing PV module being walked on during installation, wherein the roofing PV module is configured to attach to other roofing PV modules to provide a substantially watertight seal for a roof surface.

2. The roofing PV module of claim 1, wherein the first flexible joint and the second flexible joint each comprise a ribbon wire.

3. The roofing PV module of claim 2, wherein each of the plurality of solar cells comprises two paired solar cells, and wherein the plurality of local bus bars comprise a bus bar on the left side and on the right side of each PV pairing of solar cells.

4. The roofing PV module of claim 1, wherein the first flexible joint and the second flexible joint each comprise a copper foil interconnection.

5. The roofing PV module of claim 4, wherein the copper foil interconnection is electrically connected to and spans the gap between two adjacent PV tile areas, wherein the section of the copper foil interconnection spanning the gap is covered with a dielectric material.

6. The roofing PV module of claim 4, wherein the copper foil interconnection is electrically connected to and spans the gap between two adjacent PV tile areas, wherein the sections of the copper foil connected to the two PV tile areas are covered with a tin coating.

7. The roofing PV module of claim 4, wherein the copper foil has a thickness of from about 0.1 mm to about 0.4 mm.

8. The roofing PV module of claim 1, wherein the first second and third protective layers are each sheets of glass.

9. The roofing PV module of claim 1, wherein the first flexible joint and the second flexible joint each have a strain-life of about 30,000 cycles for a range of motion of up to 5°.

10. The roofing PV module of claim 1, wherein the first flexible joint and the second flexible joint each have a strain-life of about 1,000 cycles for a range of motion of up to 15°.

11. The roofing PV module of claim 1, further comprising a fourth PV tile area, arranged linearly with and adjacent to the third PV tile area.

12. The roofing PV module of claim 11, further comprising a fifth PV tile area, arranged linearly with and adjacent to the fourth PV tile area.

13. A roofing photovoltaic (PV) module comprising:
   a first PV tile area comprising a first protective layer overlaying a first plurality of solar cells;
   a second PV tile area comprising a second protective layer overlaying a second plurality of solar cells;
   a third PV tile area comprising a third protective layer overlaying a third plurality of solar cells, the first protective layer, second protective layer, and third protective layer being arranged linearly to form an elongated roofing module, with the first PV tile area adjacent to the second PV tile area, and with the second PV tile area adjacent to the third PV tile area;
   a first flexible joint, electrically and structurally connecting the first PV tile area and the second PV tile area wherein the first and second protective layers are separated by a gap and the first flexible joint spans the gap and bends to accommodate rotation of the first protective layer relative to the second protective layers;
   a second flexible joint, electrically and structurally connecting the second PV tile area and the third PV tile area, wherein the second and third protective layers are separated by a gap and the second flexible joint spans the gap and bends to accommodate rotation of the second protective layer relative to the third protective layer wherein the first flexible joint and the second flexible joint each have a strain-life of about 1,000 cycles for a range of motion of up to 5°;
   a plurality of local bus bars, wherein a pair of the local bus bars are positioned on either side of the first flexible joint and a pair of the local bus bars are positioned on either side of the second flexible joint, adapted to electrically interconnect each of the PV tile areas into a series circuit; and
   a pair of outlet bus bars, one outlet bus bar each electrically connected to opposite ends of the series circuit, and forming respective V+ and V− power outputs,
   wherein the roofing PV module is configured for installation on a roof and the flexible joints has sufficient resilience to withstand the roofing PV module being walked on during installation, wherein the roofing PV module is configured to attach to other roofing PV modules to provide a substantially watertight seal for a roof surface.

14. The roofing PV module of claim 13, wherein the first flexible joint and the second flexible joint each comprise a ribbon wire.

15. The roofing PV module of claim 14, wherein each PV tile area comprises two paired solar cells, and wherein the plurality of local bus bars comprise a bus bar on the left side and on the right side of each PV pairing of solar cells.

16. The roofing PV module of claim 13, wherein the first flexible joint and the second flexible joint each comprise a copper foil interconnection.

17. The roofing PV module of claim 16, wherein each PV tile area comprises two paired solar cells, and wherein the pair of outlet bus bars comprise a bus bar on the right side of the solar cells in the first PV tile area and a bus bar on left side of the solar cells in the third PV tile area.

18. The roofing PV module of claim 16, wherein the copper foil interconnection is electrically connected to and spans a gap between two adjacent PV tile areas, wherein the section of the copper foil spanning the gap is covered with a dielectric material.

19. The roofing PV module of claim 16, wherein the copper foil interconnection is electrically connected to and spans a gap between two adjacent PV tile areas, wherein the sections of the copper foil connected to the two PV tile areas are covered with a tin coating.

20. The roofing PV module of claim 16, wherein the copper foil has a thickness of from about 0.1 mm to about 0.4 mm.

21. The roofing PV module of claim 13, wherein the first flexible joint and the second flexible joint each have a strain-life of about 30,000 cycles for a range of motion of up to 15°.

22. The roofing PV module of claim 13, further comprising a fourth PV tile area, arranged linearly with and adjacent to the third PV tile area.

23. The roofing PV module of claim 22, further comprising a fifth PV tile area, arranged linearly with and adjacent to the fourth PV tile area.

24. A method of assembling a roofing photovoltaic (PV) module, comprising:
providing a roofing module frame with three photovoltaic tile areas in a linear arrangement, each one of the photovoltaic tile areas comprising a discrete protective layer;
setting two, paired solar cells within each photovoltaic tile area such that the paired solar cells are overlaid by a respective one of the discrete protective layers;
electrically and structurally connecting paired solar cells in adjacent photovoltaic tile areas with flexible joint connections, wherein the discrete protective layers are separated by gaps and the flexible joint connections span the gaps while allowing rotation of the protective layers of the adjacent PV tile areas within 5° measured from an unbent configuration; and
connecting outlet bus bars to outermost solar cells set within the roofing module frame,
wherein the roofing PV module is configured for installation on a roof and the flexible joints have sufficient resilience to withstand the roofing PV module being walked on during installation, wherein the roofing PV module is configured to attach to other roofing PV modules to provide a substantially watertight seal for a roof surface.

25. The method of claim 24, wherein the flexible joint connections comprise ribbon wire, and wherein electrically and structurally connecting paired solar cells comprises soldering the ribbon wire to local bus bars positioned in between solar cells in adjacent photovoltaic tile areas.

26. The method of claim 24, wherein the flexible joint connections comprise metal foil, and wherein electrically and structurally connecting paired solar cells comprises soldering the metal foil to solar cells in adjacent photovoltaic tile areas.

* * * * *